(12) United States Patent
Hasegawa et al.

(10) Patent No.: US 7,394,522 B2
(45) Date of Patent: Jul. 1, 2008

(54) EXPOSURE APPARATUS AND DEVICE MANUFACTURING METHOD

(75) Inventors: Noriyasu Hasegawa, Utsunomiya (JP); Tomofumi Nishikawara, Kawachi-gun (JP); Keita Sakai, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/755,380

(22) Filed: May 30, 2007

(65) Prior Publication Data

US 2008/0002169 A1 Jan. 3, 2008

(30) Foreign Application Priority Data

Jun. 30, 2006 (JP) ............... 2006-181894
Apr. 27, 2007 (JP) ............... 2007-119032

(51) Int. Cl.
G03B 27/42 (2006.01)
G03B 27/52 (2006.01)

(52) U.S. Cl. .......................... 355/53; 355/30
(58) Field of Classification Search ............ 355/30, 355/53, 55, 67; 250/548
See application file for complete search history.

(56) References Cited

U.S. PATENT DOCUMENTS

2004/0160582 A1* 8/2004 Lof et al. ............... 355/30
2006/0231206 A1 10/2006 Nagasaka et al.
2006/0250593 A1 11/2006 Nishii
2007/0146663 A1* 6/2007 Nagasaka ............... 355/53
2007/0252964 A1* 11/2007 Kohno et al. ............ 355/53

FOREIGN PATENT DOCUMENTS

JP 2005-353820 12/2005
WO 99-49504 9/1999
WO 2005-029559 3/2005

* cited by examiner

*Primary Examiner*—Hung Henry Nguyen
(74) *Attorney, Agent, or Firm*—Canon U.S.A., Inc., IP Division

(57) ABSTRACT

At least one exemplary embodiment is directed to an exposure apparatus for exposing a substrate. The exposure apparatus includes a movable substrate stage, a projection optical system configured to project light from an original and including a final optical element, and a nozzle member provided around the final optical element and including an opposing surface opposing the substrate. The substrate is exposed via liquid filled between a final surface of the projection optical system and the substrate, the projection optical system, and the original. The opposing surface includes a supply port, a first recovery port provided farther from an optical axis of the final optical element than the supply port, and a first portion and a second portion provided between the supply port and the first recovery port. The distance between the first portion and the substrate is longer than the distance between the supply port and the substrate.

15 Claims, 10 Drawing Sheets

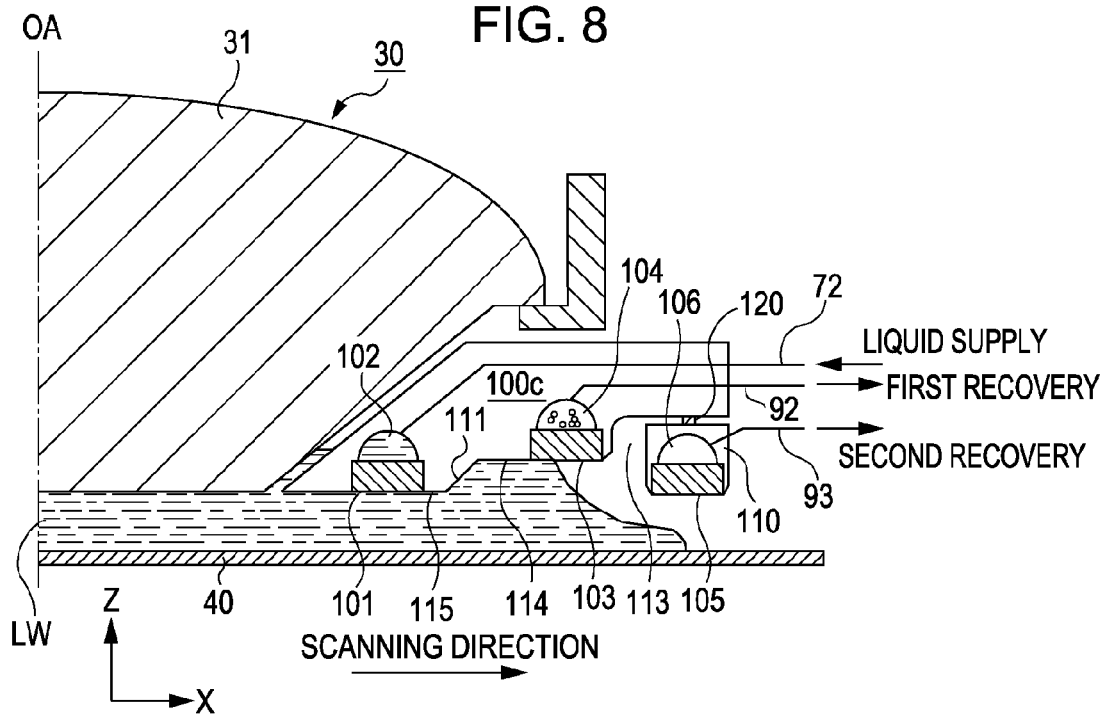
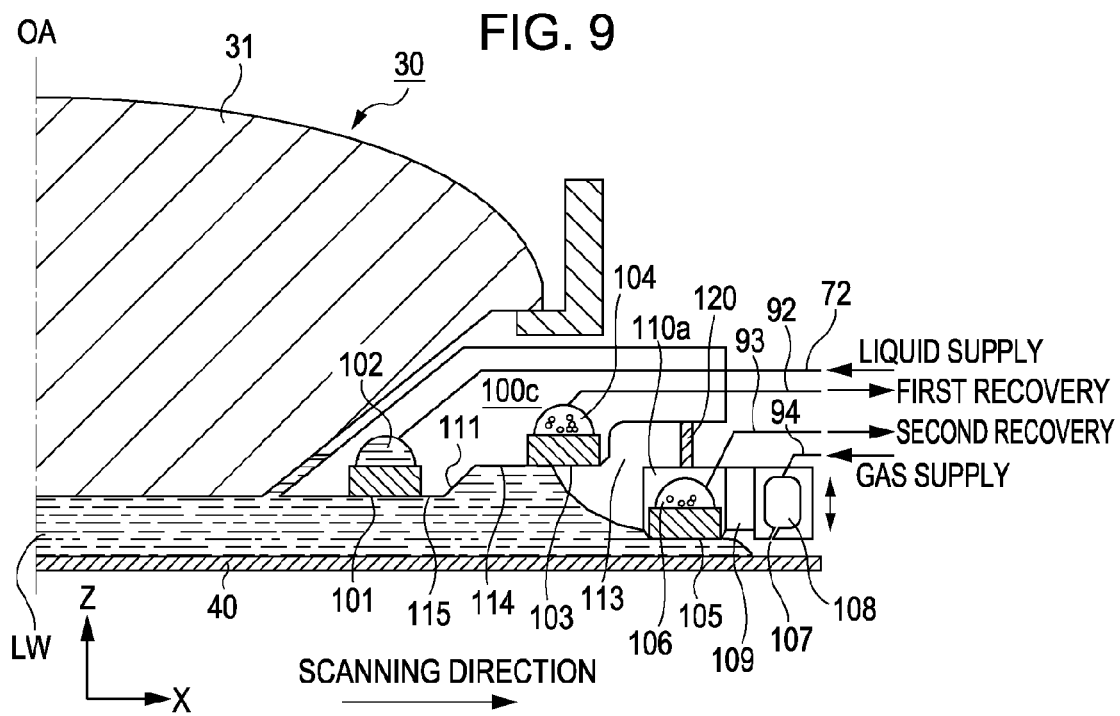

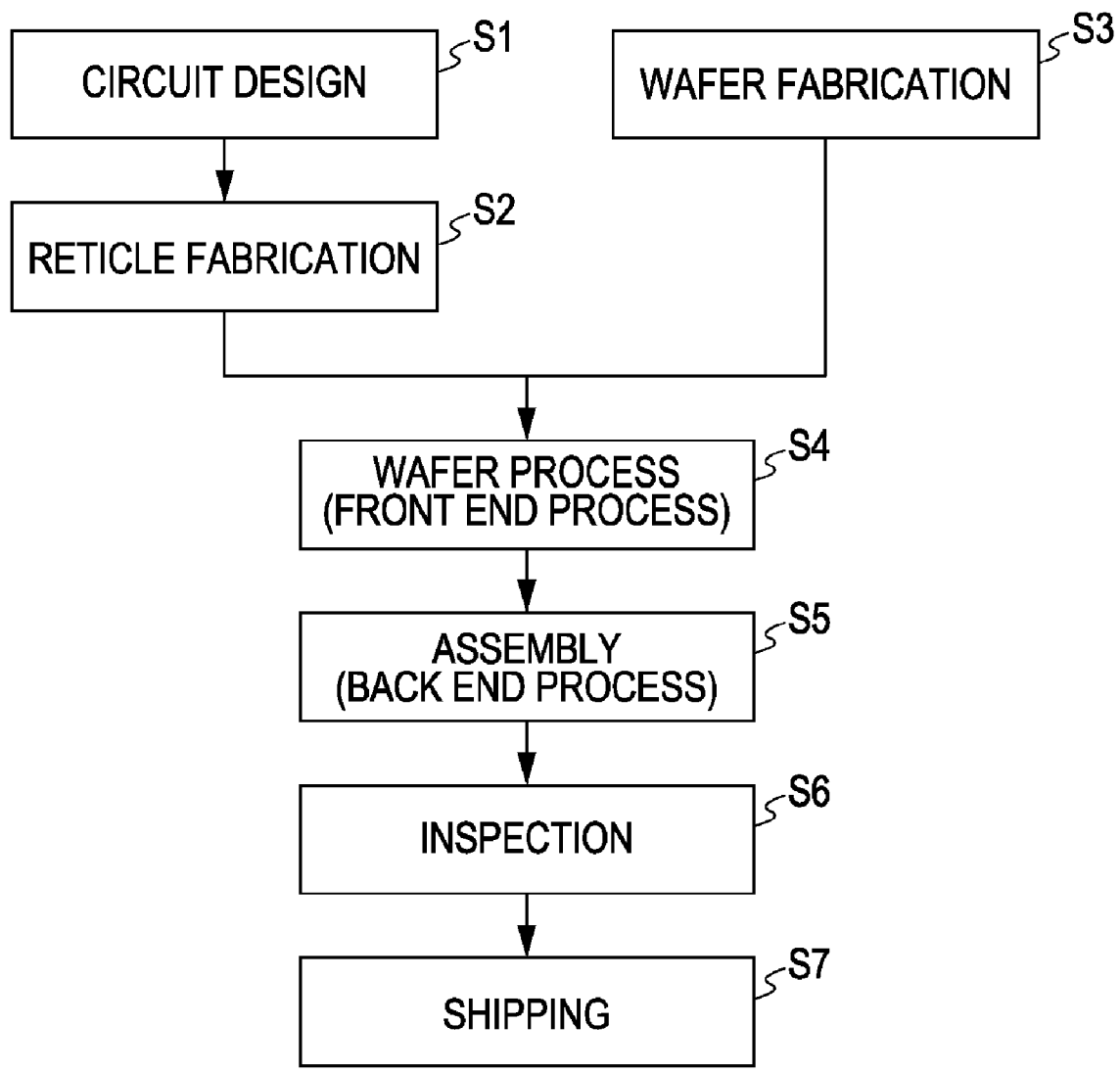

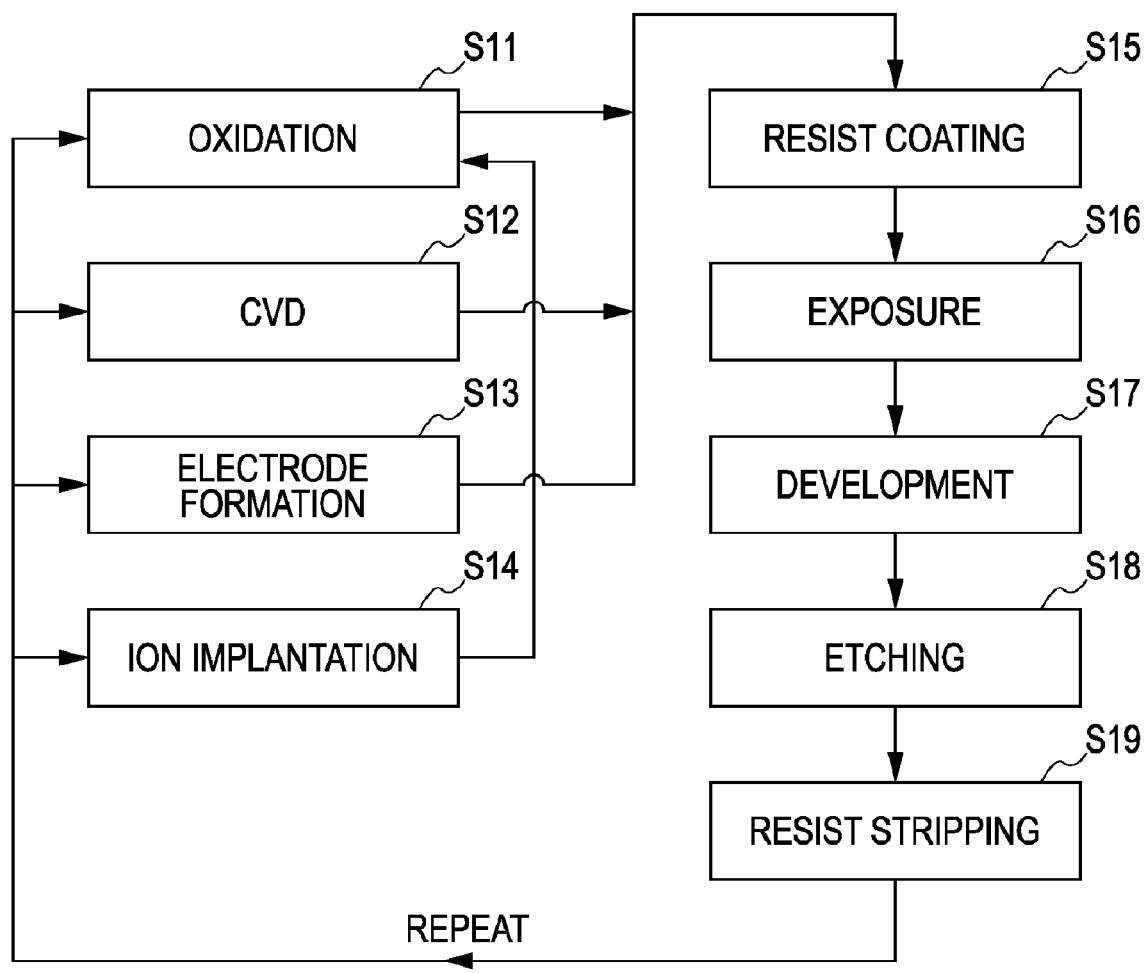

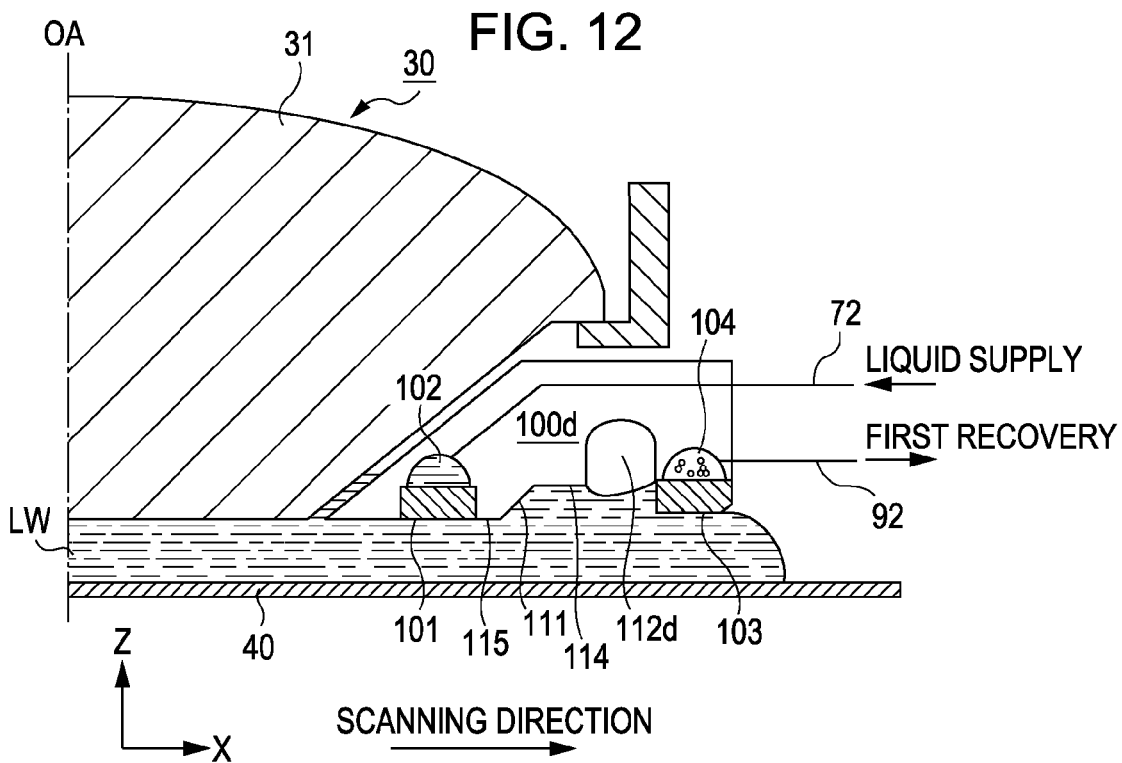
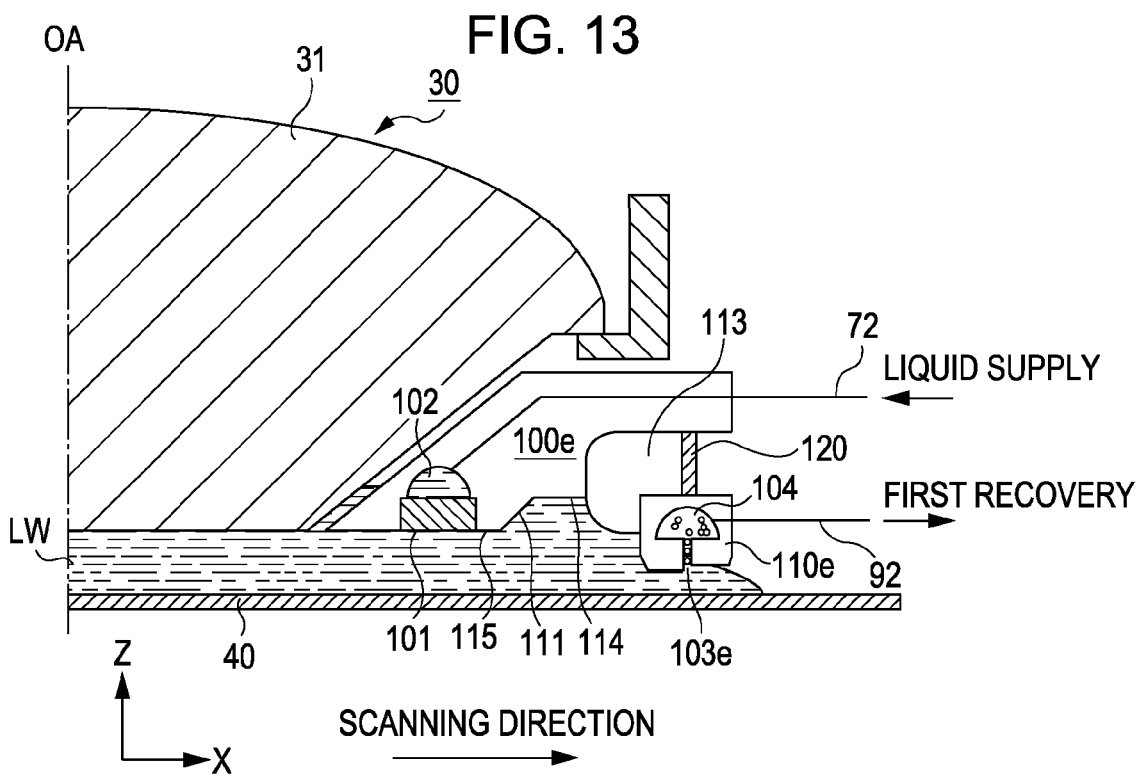

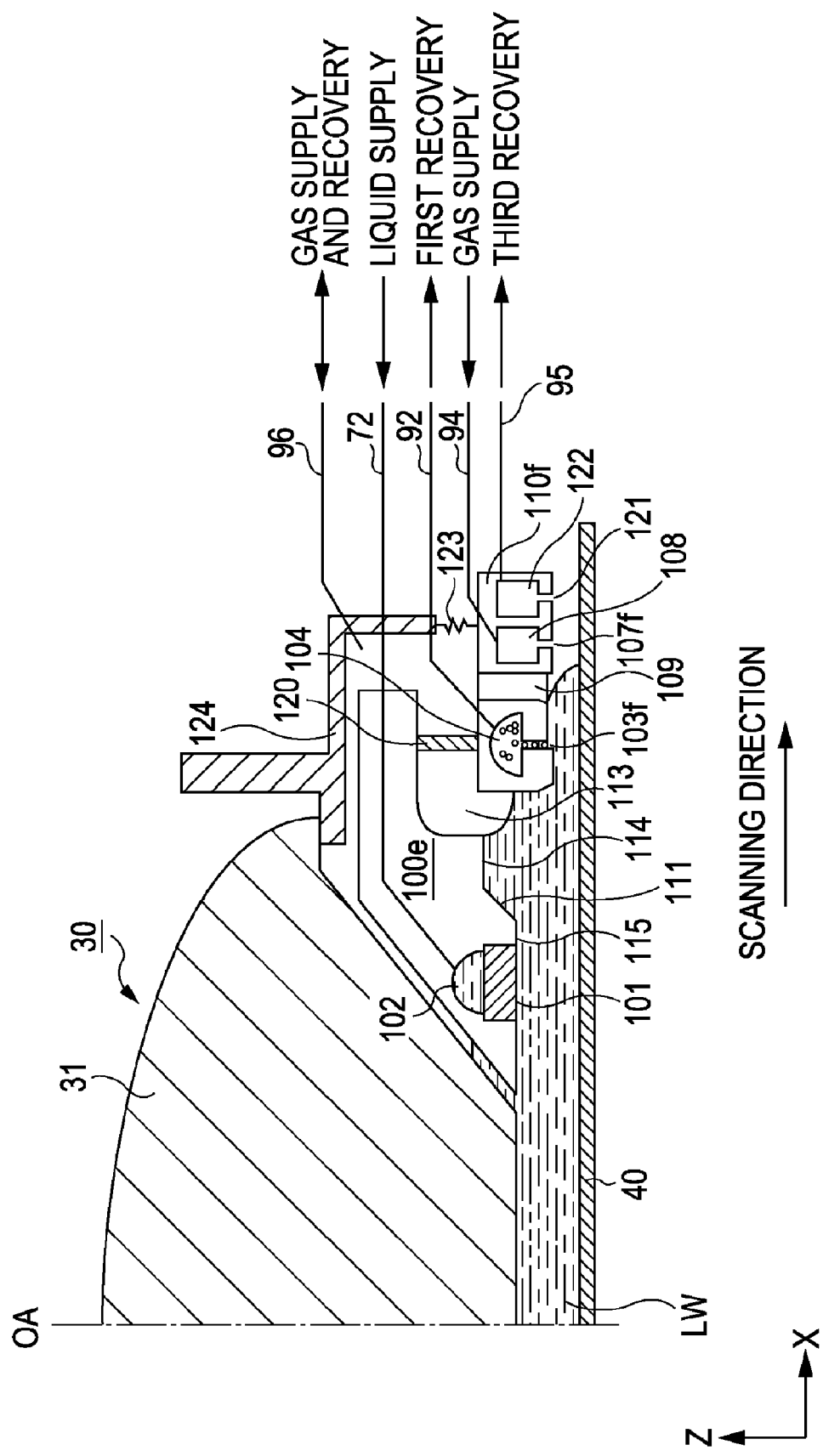

EXPOSURE APPARATUS AND DEVICE MANUFACTURING METHOD

BACKGROUND OF THE INVENTION

1. Field of the Invention

The present invention relates to an exposure apparatus and a device manufacturing method.

2. Description of the Related Art

Projection exposure apparatuses have been used to project and transfer a pattern on a reticle (mask) onto a wafer via a projection optical system. In recent years, there is an increasing demand for exposure apparatuses that achieve high resolving power, high transfer accuracy, and high throughput. As one method that satisfies this demand for high definition, immersion exposure has attracted attention. In immersion exposure, the numerical aperture (NA) of the projection optical system is increased by using liquid as a medium on the wafer side of the projection optical system. The projection optical system has an $NA=n \times \sin \theta$ where n is a refractive index of the medium. Therefore, the NA can be increased to n by filling the gap (also referred to as a 'space') between the projection optical system and the wafer with a medium having a refractive index ($n>1$) higher than the refractive index of air. Further, the resolving power R of the exposure apparatus determined by the process coefficient k1 and the wavelength $\lambda$ ($R=k1 \times (\lambda/NA)$) is decreased.

As one immersion exposure method, International Publication No. WO99/49504 proposes a local fill method in which the space between a final surface of a projection optical system and a wafer is locally filled with liquid. In the local fill method, it is important to uniformly apply the liquid in a small space between the final surface of the projection optical system and the wafer. For example, if liquid hits on the final surface (final lens) of the projection optical system and flows around the final surface, bubbles are formed in the liquid. Further, if the wafer is moved at a high speed, the liquid spreads or scatters around, and the amount of liquid is reduced. Consequently, bubbles can be easily formed in the liquid. Since the bubbles diffusely reflect exposure light, the amount of exposure light is reduced, and the throughput is reduced. Moreover, since the bubbles hinder the exposure light from reaching the wafer, transfer accuracy is deteriorated.

Japanese Patent Laid-Open No. 2005-353820 discloses an immersion exposure apparatus in which a second liquid recovery port is provided around a final surface of a projection optical system. This immersion exposure apparatus restrains liquid from spreading out.

Further, International Publication No. WO2005/029559 discloses an immersion exposure apparatus in which a secondary liquid recovery port is provided in an inclined trap surface. The trap surface is inclined relative to the XY plane such as to extend away (upward) from a surface of a substrate as it extends toward the outside of an immersion region. The trap surface is subjected to lyophilic treatment. Since films (e.g., a photoresist, an antireflection film, and a protective film) applied on the surface of the substrate are normally water repellant (liquid repellent), liquid flowing out of the second liquid recovery port is trapped by the trap surface. This immersion exposure apparatus having the above-described configuration further restrains the liquid from spreading out.

As described above, in the immersion exposure apparatuses disclosed in Japanese Patent Laid-Open No. 2005-353820 and International Publication No. WO2005/029559, the second liquid recovery port can restrain the liquid from spreading out. However, when a wafer stage moves at a high speed, an interface of the liquid also moves in the moving direction of the wafer stage, and therefore, air easily enters under the projection optical system. As a result, bubbles are easily formed in the liquid. The formation of the bubbles in the liquid can cause reduction in transfer accuracy as described above.

In the exposure apparatus disclosed in International Publication No. WO2005/029559, it can be expected, depending on the inclination angle of the trap surface, that the trap surface prevents the interface of the liquid from moving downward from the projection optical system. In this case, however, the portion near the recovery port where the interface of the liquid normally lies is inclined, and therefore, the pressure of the liquid is changed with the movement of the interface of the liquid. This change in pressure disturbs the driving control of the stage, and decreases the overlay accuracy of the exposure apparatus. As a result, it is difficult to increase the moving speed of the stage.

SUMMARY OF THE INVENTION

The present invention provides an exposure apparatus that is superior in resolving power and throughput.

An exposure apparatus for exposing a substrate according to an aspect of the present invention includes a movable substrate stage configured to hold the substrate; a projection optical system configured to project light from an original, and including a final optical element opposing the substrate; and a nozzle member provided around the final optical element, and including an opposing surface opposing the substrate. The substrate is exposed via liquid filled in a space between a final surface of the projection optical system and the substrate, the projection optical system, and the original. The opposing surface of the nozzle member includes a supply port configured to supply the liquid into the space, and provided substantially parallel to a plane orthogonal to an optical axis of the final optical element; a first recovery port configured to recover the liquid from the space, and provided farther from the optical axis than the supply port; and a section provided between the supply port and the first recovery port. The section includes a first portion substantially parallel to the plane orthogonal to the optical axis, and a second portion provided between the supply port and the first portion and including an inclined face, the inclined face being closer to the substrate as the inclined face is closer to the optical axis. A first distance between the first portion and the substrate is longer than a second distance between the supply port and the substrate.

A method of manufacturing a device according to another aspect of the present invention includes the steps of exposing a substrate to light using the above-described exposure apparatus; developing the exposed substrate; and processing the developed substrate to manufacture the device.

Other features besides those discussed above shall be apparent to those skilled in the art from the description of exemplary embodiments of the invention which follows. In the description, reference is made to accompanying drawings, which form apart thereof, and which illustrate an example of the invention. Such example, however, is not exhaustive of the various exemplary embodiments of the invention.

BRIEF DESCRIPTION OF THE DRAWINGS

The accompanying drawings, which are incorporated in and constitute a part of the specification, illustrate exemplary embodiments of the invention and, together with the description, serve to explain at least some of the principles of the invention.

FIG. 8 is a cross-sectional view of the principle part of the exposure apparatus according to the seventh exemplary embodiment.

FIG. 9 is a cross-sectional view of the principle part of an exposure apparatus according to an eighth exemplary embodiment of the present invention.

FIG. 10 is a flowchart showing a device manufacturing method.

FIG. 11 is a detailed flowchart explaining a wafer process shown in FIG. 10.

FIG. 12 is a cross-sectional view of the principle part of an exposure apparatus according to a second exemplary embodiment of the present invention.

FIG. 13 is a cross-sectional view of the principle part of an exposure apparatus according to a third exemplary embodiment of the present invention.

FIG. 16 is a cross-sectional view of the principle part of an exposure apparatus according to a modification of the fourth exemplary embodiment.

DESCRIPTION OF THE EMBODIMENTS

Figure 1:
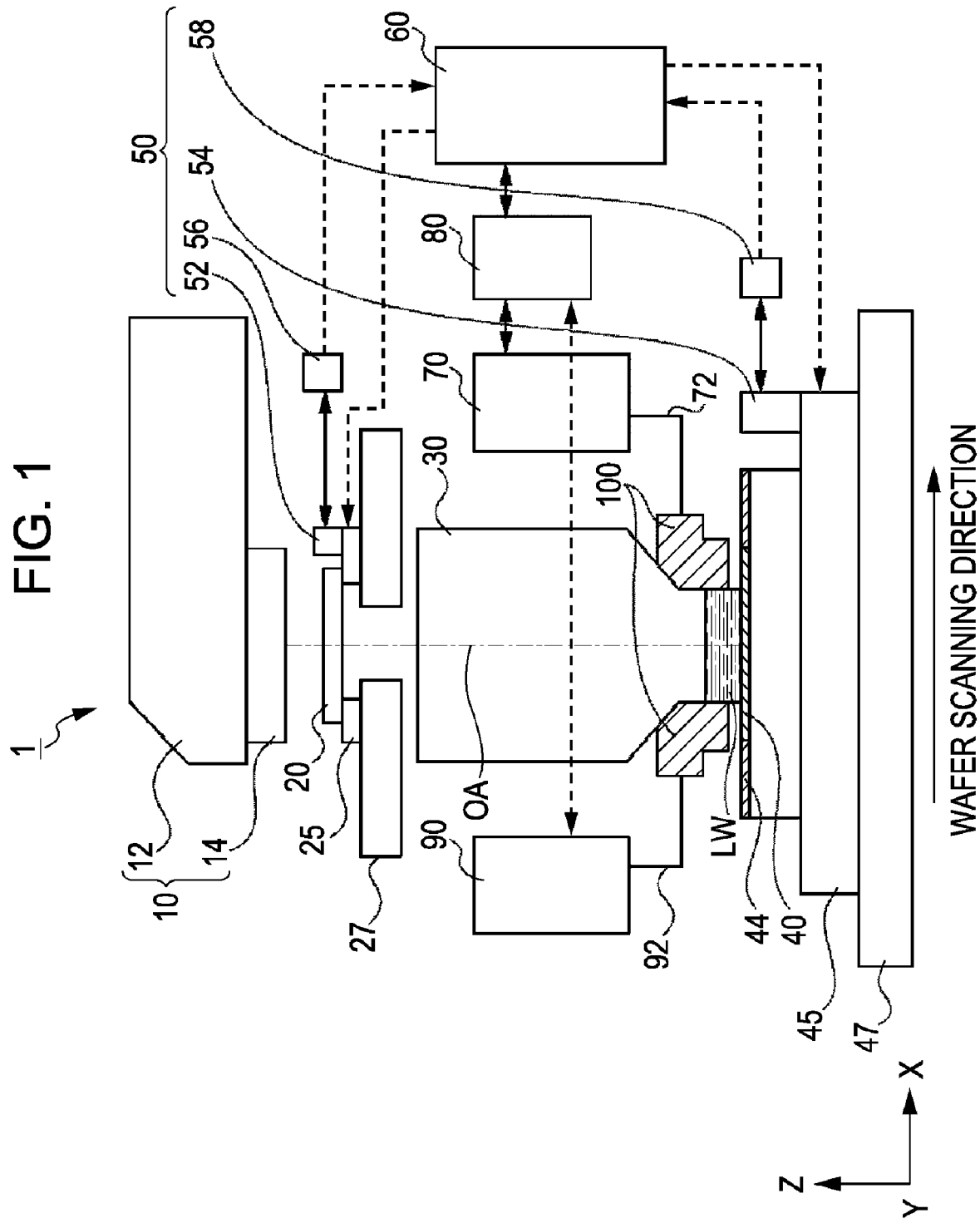
FIG. 1 is a schematic cross-sectional view showing a configuration of an exposure apparatus according to a first exemplary embodiment of the present invention.

Exposure apparatuses according to exemplary embodiments of the present invention will be described below with reference the accompanying drawings. In the drawings, the same or similar components are denoted by the same or similar reference numerals, and redundant descriptions thereof are omitted appropriately.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example the fabrication of a medium supply unit.

In all of the examples illustrated and discussed herein any specific values, for example distance between the projection optical system 30 and the wafer 40, should be interpreted to be illustrative only and non limiting. Thus, other examples of the exemplary embodiments could have different values.

Notice that similar reference numerals and letters refer to similar items in the following figures, and thus once an item is defined in one figure, it may not be discussed for following figures.

Note that herein when referring to correcting or corrections of an error (e.g., measurement error), a reduction of the error and/or a correction of the error is intended. Additionally when referring to preventing, for example preventing the scattering of the liquid LW, a reduction of the scattering is also or alternatively intended.

First Exemplary Embodiment

FIG. 1 is a schematic cross-sectional view showing a configuration of an exposure apparatus 1 according to a first exemplary embodiment of the present invention.

The exposure apparatus 1 is an immersion-type projection exposure apparatus. In the exposure apparatus 1, a wafer (also referred to as a substrate) 40 is exposed in a step-and-scan method via a transfer circuit pattern provided on a reticle 20 (also referred to as an original), a projection optical system 30, and liquid (immersion liquid) LW in a state in which a space between the projection optical system 30 and the wafer 40 is filled with the liquid LW. In FIG. 1, OA represents the optical axis of the projection optical system 30. The exposure apparatus 1 is also applicable to a step-and-repeat method.

As shown in FIG. 1, the exposure apparatus 1 includes an illumination device 10, a movable reticle stage 25 on which the reticle 20 is set, the projection optical system 30, a movable wafer stage (also referred to as a substrate stage) 45 on which the wafer 40 is set, a distance measuring device 50, a stage control unit 60, and other components. The other components include a medium supply unit 70, an immersion control unit 80, a liquid recovery unit 90, and a nozzle member 100.

The illumination device 10 includes a light source unit 12 and an illumination optical system 14 that illuminate the reticle 20 having the transfer circuit pattern.

In the first exemplary embodiment, the light source unit 12 adopts an ArF excimer laser with a wavelength of approximately 193 nm as a light source. Instead of the ArF excimer laser, the light source unit 12 can adopt, for example, a KrF excimer laser with a wavelength of approximately 248 nm, an F2 laser with a wavelength of approximately 157 nm, or a lamp such as a mercury lamp or a xenon lamp or any other appropriate lamp as determined by one of ordinary skill in the relevant art.

The illumination optical system 14 illuminates the reticle 20, and includes a lens, a mirror, an optical integrator, a diaphragm, and so on. For example, a condenser lens, an optical integrator, an aperture diaphragm, a condenser lens, a slit, and an imaging optical system are arranged in that order.

The reticle 20 is transported from the outside of the exposure apparatus 1 by a reticle transport system (not shown), and is held by the reticle stage 25. The reticle 20 is made, for example, of quartz, and a circuit pattern to be transferred is formed thereon. Diffracted light from the reticle 20 passes through the projection optical system 30, and is then projected onto the wafer 40. The reticle 20 and the wafer 40 are arranged in an optically conjugate relationship. Since the exposure apparatus 1 adopts a step-and-scan method, the pattern of the reticle 20 is transferred onto the wafer 40 by scanning the reticle 20 and the wafer 40 at the speed ratio in accordance with the reduction ratio. If the exposure apparatus 1 adopts a step-and-repeat method, exposure is performed while the reticle 20 and the wafer 40 stay still.

The reticle stage 25 is supported by a platen 27. The reticle stage 25 supports the reticle 20 via a reticle chuck (not shown), and the movement thereof is controlled by a moving mechanism (not shown) and the stage control unit 60. The moving mechanism includes a linear motor, etc., and moves the reticle 20 by driving the reticle stage 25 in a scanning direction (an X-axis direction in the first exemplary embodiment).

The projection optical system 30 serves to focus (project) the diffracted light passing through the pattern of the reticle 20 onto the wafer 40. For example, the projection optical system 30 can be formed of a refractive optical system including only a plurality of lens elements, or a catadioptric optical system including a plurality of lens elements and at least one concave mirror.

The wafer 40 is transported from the outside of the exposure apparatus 1 by a wafer transport system (not shown), and is held by the wafer stage 45. The wafer 40 is an object to be exposed, and can include a liquid crystal substrate and other objects to be exposed. A photoresist is applied on the wafer 40.

A top plate (liquid holding portion) 44 holds the liquid LW in a manner such that the surface of the wafer 40 supported by the wafer stage 45 is substantially flush with a region (wafer stage 45) outside the wafer 40. Since the top plate 44 is substantially flush with the surface of the wafer 40, it can hold the liquid LW (form a liquid film) even in the region outside the wafer 40 when shot exposure is conducted on the adjacency of the outer periphery of the wafer 40.

For example, when the liquid LW is water, a face of the top plate 44 in contact with the liquid LW can be formed of a material (coating material) that is generally known as highly water-repellent, such as fluorine resin or vapor deposition polymerization resin. Specifically, the fluorine resin includes polymers containing tetrafluoroethylene (TFE). More specifically, polytetrafluoroethylene (PTFE) serving as a polymer of TFE, a perfluoroalkylvinylether resin (PFA) serving as a copolymer of TFE and perfluoroalkoxyethylene, and a perfluoroethylene-propylene copolymer resin (FEP) serving as a copolymer of TFE and hexafluoropropylene can be used.

The vapor deposition polymerization resin includes paraxylylene and a polymer containing a derivative of paraxylylene. Specifically, parylene (a polyparaxylylene resin developed by Union Carbide Chemical and Plastics Co., USA, or UCCPC) can be used. More specifically, Parylene N (trade name of polyparaxylylene from UCCPC), Parylene C (trade name of polymonochloroparaxylylene from UCCPC), and Parylene D (trade name of polydichloroparaxylylene from UCCPC) can be used.

For these resins, the contact angle with the liquid can be controlled by adjusting the polymerization degree or polymerization rate or adding a functional group or a derivative.

Alternatively, the face of the top plate 44 can be treated with a silane coupling agent such as silane containing a perfluoroalkyl group (heptadecafluorodecylsilane).

Further, the face of the top plate 44 coated with, for example, fluorocarbon resin can have a fine structure with asperities or needles in order to adjust the surface roughness. This fine structure further increases wettability of a material having high wettability, and further decreases wettability of a material having low wettability. In other words, the fine structure can increase the apparent contact angle of the top plate 44.

The wafer stage 45 is supported by a platen 47, and holds the wafer 40 via a wafer chuck (not shown). The wafer stage 45 serves to adjust the vertical (Z-axis direction) position, rotating direction, and inclination of the wafer 40. The movement of the wafer stage 45 is controlled by the stage control unit 60 so that the surface of the wafer 40 constantly coincides with the focal plane of the projection optical system 30 with high precision during exposure.

The distance measuring device 50 measures the position of the reticle stage 25 and the two-dimensional position of the wafer stage 45 in real time via reference mirrors 52 and 54 and laser interferometers 56 and 58. The result of measurement by the distance measuring device 50 is transmitted to the stage control unit 60. On the basis of the measured distance, the stage control unit 60 drives the reticle stage 25 and the wafer stage 45 at a fixed speed ratio for positioning and synchronous control.

The stage control unit 60 controls the driving of the reticle stage 25 and the wafer stage 45.

Figure 2:
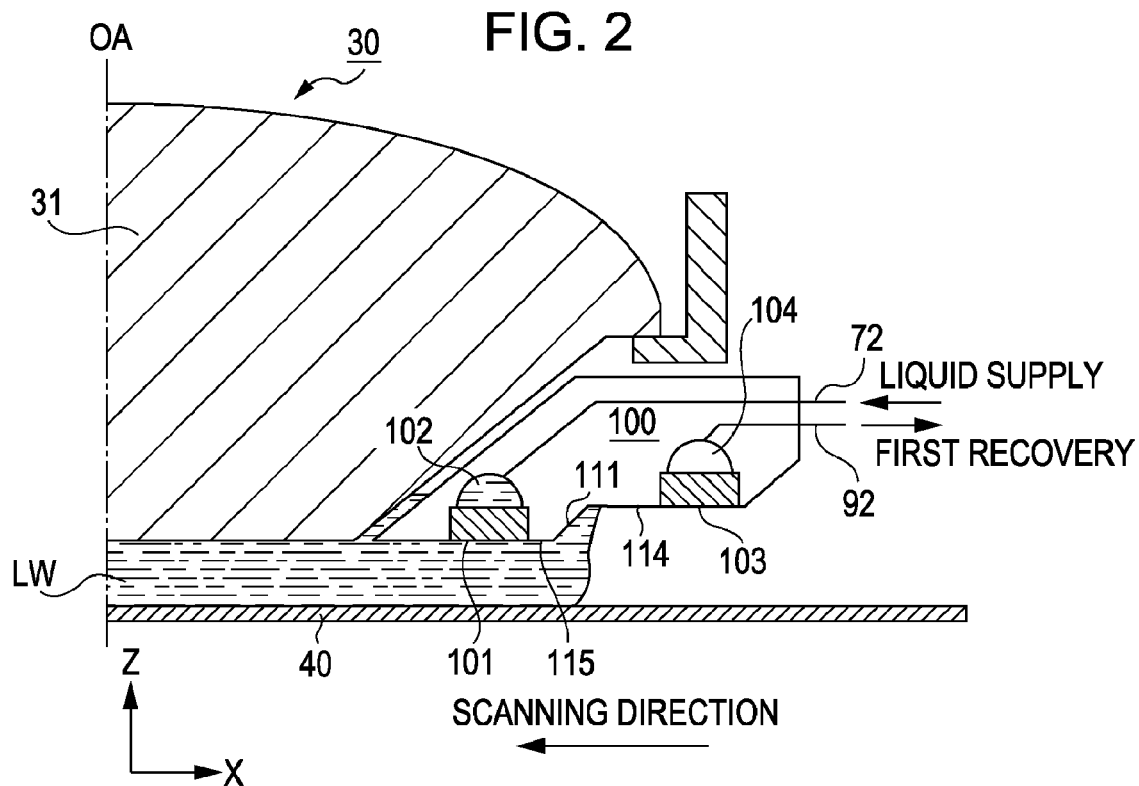
FIG. 2 is a cross-sectional view of the principal part of the exposure apparatus shown in FIG. 1.

The medium supply unit 70 supplies the liquid LW into a space between the projection optical system 30 and the wafer 40, as shown in FIG. 2. The medium supply unit 70 includes a generator, a deaerator (degasifier), and a temperature controller that are not shown, and a liquid supply pipe 72. In other words, the medium supply unit 70 supplies the liquid LW via (a liquid supply port 101 of) the liquid supply pipe 72 provided around the final surface of the projection optical system 30, thereby forming a film of the liquid LW in the space between the projection optical system 30 and the wafer 40. For example, the distance between the projection optical system 30 and the wafer 40 is set so that the film of the liquid LW can be stably formed and removed, for example, set at approximately 1.0 mm.

For example, the medium supply unit 70 also includes a tank for storing the liquid LW, a pressure feeder for feeding the liquid LW out, and a flow-rate controller for controlling the flow rate of supplied liquid LW.

The liquid LW is selected from among materials that negligibly absorb exposure light. Further, in at least one exemplary embodiment the liquid LW can have a refractive index equivalent to that of a refractive optical element such as quartz or fluorite. More specifically, the liquid LW is, for example, pure water, functional water, or fluoride liquid such as fluorocarbon. In at least one exemplary embodiment, the dissolved gas is sufficiently removed beforehand from the liquid LW by the deaerator (degasifier). In this case, formation of bubbles in the liquid LW is suppressed, or even when bubbles are formed, they can be immediately absorbed into the liquid LW. For example, nitrogen and oxygen that are mainly contained in the air are objects to be removed, and 80% of the amount thereof that can be dissolved in the liquid LW is removed. This can sufficiently avoid formation of bubbles. Of course, the liquid LW can be supplied to the medium supply unit 70 while constantly removing dissolved gas from the liquid LW by a deaerator (degasifier) provided in the exposure apparatus 1.

The generator reduces impurities, such as metal ion, microparticles, and organic substances, contained in material water supplied from a material-water supply source (not shown), and generates the liquid LW. The liquid LW generated by the generator is supplied to the deaerator (degasifier).

The deaerator (degasifier) deaerates the liquid LW so as to reduce oxygen and nitrogen dissolved in the liquid LW. For example, the deaerator (degasifier) includes a film module and a vacuum pump. In at least one exemplary embodiment, in the deaerator (degasifier), the liquid LW is supplied to one side of a gas-permeable film, a vacuum is formed on the other side, and dissolved gas in the liquid LW is let into the vacuum via the film.

The temperature controller controls the temperature of the liquid LW so as to be a predetermined temperature.

The liquid supply pipe 72 supplies the liquid LW, which has been deaerated by the deaerator (degasifier) and temperature-controlled by the temperature controller, into the space between the projection optical system 30 and the wafer 40 via a liquid supply port 101 provided in the nozzle member 100 that will be described below. That is, the liquid supply pipe 72 is connected to the liquid supply port 101. FIG. 2 is a schematic cross-sectional view of the nozzle member 100.

In at least one exemplary embodiment, the liquid supply pipe 72 is formed of a resin that contains few eluting substances (eluting materials), such as polytetrafluoroethylene resin, polyethylene resin, or polypropylene resin, in order to prevent contamination of the liquid LW. When the liquid LW is not pure water, the liquid supply pipe 72 is formed of a material that is resistant to the liquid LW and contains few eluting substances (eluting materials).

The immersion control unit 80 obtains, from the stage control unit 60, information about the present position, speed, accelerated speed, target position, and moving direction of the wafer stage 45, and controls immersion exposure on the basis of the information. The immersion control unit 80 gives control commands, which are concerned with switching between supply and recovery of the liquid LW, stop of supply and recovery, and the flow rate of liquid LW to be supplied and recovered, to the medium supply unit 70 and the medium recovery unit 90.

The medium recovery unit 90 recovers the liquid LW supplied from the medium supply unit 70. In the first exemplary embodiment, the medium recovery unit 90 includes a liquid recovery pipe 92, a tank that temporarily stores the recovered liquid LW, a sucking section for sucking the liquid LW, and a flow-rate controller for controlling the flow rate of the liquid LW during recovery.

The liquid recovery pipe 92 recovers the supplied liquid LW via a liquid recovery port (also referred to as a first recovery port) 103 provided in the nozzle member 100 that will be described below. In at least one exemplary embodiment, the liquid recovery pipe 92 is formed of a resin that contains few eluting substances (eluting materials), such as polytetrafluoroethylene resin, polyethylene resin, or polypropylene resin, in order to prevent contamination of the liquid LW. When the liquid LW is not pure water, the liquid recovery pipe 92 is formed of a material that is resistant to the liquid LW and contains few eluting substances (eluting materials).

Figure 3:
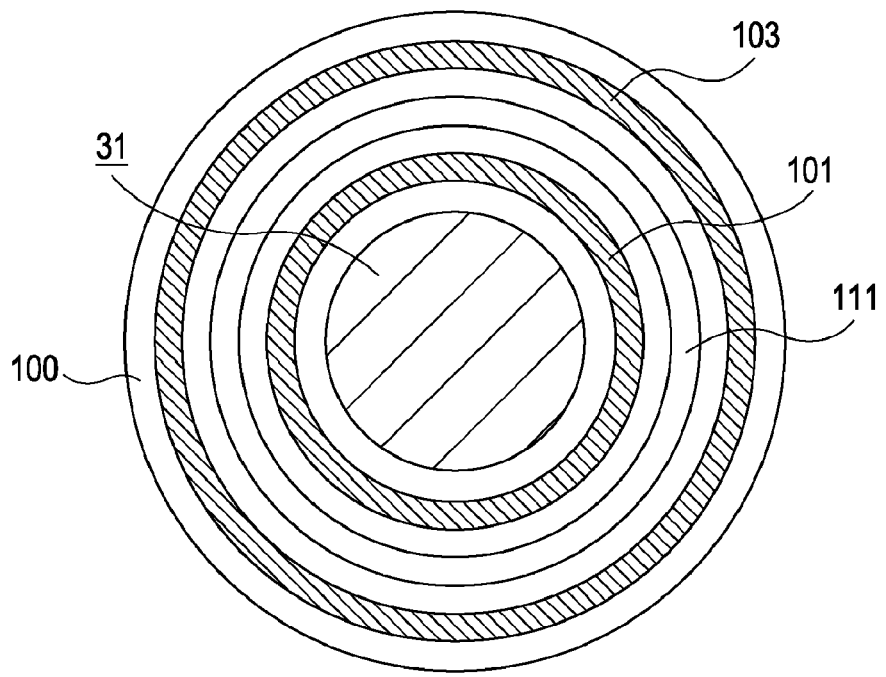
FIG. 3 is a schematic view of the principal part shown in FIG. 2, as viewed from the –Z-direction.

FIG. 3 is a schematic view of the section shown in FIG. 2, as viewed from the −Z-direction. The nozzle member 100 surrounds a final optical member (also referred to as a final optical element) 31 of the projection optical system 30. Here, OA represents the optical axis of the final optical member 31. The nozzle member 100 and the final optical member 31 are supported such as not to be in direct contact with each other. The nozzle member 100 includes the liquid supply port 101 and the liquid recovery port 103. Liquid LW is supplied through the liquid supply port 101 that is connected to the liquid supply pipe 72 via a space 102. The space 102 forms a channel through which the liquid LW is uniformly supplied from the liquid supply pipe 72 to the liquid supply port 101. The liquid supply port 101 is annular and is provided near the projection optical system 30 such as to face the wafer 40. While the liquid supply port 101 is annular in the first exemplary embodiment, it can have other shapes. Moreover, the liquid supply port 101 does not always need to have a closed form around the projection optical system 30, that is, it can be provided in an intermittent form.

While a porous member is fitted in the liquid supply port 101 in FIG. 2, the liquid supply port 101 can be shaped like a slit. As the porous member, a porous body obtained by sintering a metal or inorganic material in the form of fibers or particles (powder) is particularly suitable. The porous body (a material that forms at least a surface of the body) can be formed, for example, of stainless steel, nickel, aluminum, $SiO_2$, SiC, or SiC having $SiO_2$ formed only on its surface by heat treatment.

The supplied liquid LW is recovered through the liquid recovery port 103. The liquid recovery port 103 is connected to the liquid recovery pipe 92 via a space 104. The space 104 forms a channel through which the liquid LW is uniformly recovered from the liquid recovery port 103.

In the first exemplary embodiment, the liquid recovery port 103 is concentric, and faces the wafer 40. A porous member such as a sponge can be fitted in the liquid recovery port 103, or the liquid recovery port 103 can be shaped like a slit. As the porous member, a porous body obtained by sintering a metal or inorganic material in the form of fibers or particles (powder) is particularly suitable. The porous body (a material that forms at least a surface of the body) can be formed, for example, of stainless steel, nickel, aluminum, $SiO_2$, SiC, or SiC having $SiO_2$ formed only on its surface by heat treatment. As shown in FIGS. 2 and 3, the liquid recovery port 103 is provided outside the liquid supply port 101. This prevents the liquid LW from leaking out to the adjacency of the projection optical system 30. While the liquid recovery port 103 is annular in the first exemplary embodiment, it can have other shapes, or can be intermittently formed around the projection optical system 30, similar to the liquid supply port 101.

FIG. 2 shows a state in which the liquid LW moves with high-speed movement of the wafer stage 45. When the wafer stage 45 moves in the −X-direction, the liquid LW also moves in the −X-direction. The distance (space) from the liquid supply port 101 provided in a face 115 (opposing the wafer 40) of the nozzle member 100 to the surface of the wafer 40 is shorter than the distance (space) from the liquid recovery port 103 similarly provided in the face 115 to the surface of the wafer 40. In this case, since the liquid LW flows into a smaller space, an interface of the liquid LW does not easily reach the adjacency of the liquid supply port 101. Further, since the distance from the liquid supply port 101 to the wafer 40 is short, the dynamic pressure of the liquid LW flowing from the liquid supply port 101 to an outer side with respect to the optical axis OA (to a side of the liquid supply port 101 remote from the optical axis OA) can be increased. Consequently, bubbles formed at or near the interface of the liquid LW do not easily reach the space between the final optical member 31 and the wafer 40. By thus restraining the interface of the liquid LW from reaching near the liquid supply port 101, exposure failure can be reduced.

During high-speed movement of the wafer stage 45, the interface (gas-liquid interface) of the liquid LW moves along a first portion 114 of the face 115 of the nozzle member 100 (a portion substantially parallel to a plane orthogonal to the optical axis OA of the final optical member 31). When the distance between the first portion 114 and the surface of the wafer 40 is short (for example, 1 mm or less), the pressure of the liquid LW is markedly changed by a change in the meniscus shape of the interface, and vibration is transmitted to the final optical member 31 and the wafer stage 45. This decreases exposure accuracy. In order to suppress the change in pressure of the liquid LW, the distance between the first portion 114 and the surface of the wafer 40 can be longer than 1 mm.

When the distance between the first portion 114 and the surface of the wafer 40 is long (for example, 3 mm or more), the amount of liquid LW that spreads out with high-speed movement of the wafer stage 45 increases, and the liquid LW easily scatters. In order to suppress scattering of the liquid LW, the distance between the first portion 114 and the surface of the wafer 40 can be shorter than 3 mm.

The liquid recovery port 103, the first portion 114, and a second portion 111 of the face 115 including an inclined face are subjected to lyophilic treatment so that the interface of the liquid LW is maintained at the first portion 114 or the liquid recovery port 103 provided in substantially the same plane as the first portion 114. Further, the liquid supply port 101 provided in the face 115 (substantially parallel to the plane orthogonal to the optical axis OA) and a portion provided in the same plane as the liquid supply port 101 are also subjected to lyophilic treatment. This can restrain formation of bubbles when a liquid film is formed under the final optical member 31.

When the liquid LW is pure water, $SiO_2$, SiC, SiC having $SiO_2$ formed on only its surface by heat treatment, or a highly stable glass ceramics (e.g., Zerodur from Schott Corporation) is suitably used for lyophilic treatment. When the liquid LW is not pure water, materials, which are resistant and lyophilic to the liquid LW and include few substances that elute in the liquid LW, can be used.

In order to restrain the liquid LW from spreading out with high-speed movement of the wafer stage 45, a portion of the face 115 farther from the optical axis OA than the liquid recovery port 103 is subjected to liquid repellent treatment. When the liquid LW is pure water, a fluorine resin can be used for liquid repellent treatment. In particular, when PTFE, PFA, or silane containing a perfluoroalkyl group is used, the contact angle of pure water with respect to the treated surface can be 90° or more.

As the inclination angle of the inclined face of the second portion 111 becomes closer to the right angle (parallel to the optical axis OA), a part of the interface sometimes moves in the second portion 111 when the wafer stage 45 moves at a high speed and for a long distance. In this case, bubbles are easily caught in the second portion 111. For this reason, as shown in FIG. 2, the distance (space) between the inclined face of the second portion 111 and the wafer 40 increases away from the optical axis OA. The inclination (inclined face) of the second portion 111 restrains the bubbles from being caught. In this case, a part of the nozzle member 100 serves as the inclined face.

In order to avoid formation of bubbles, the inclination angle of the second portion 111 can be 45° or less with respect to the plane orthogonal to the optical axis OA.

If the first portion 114 is inclined or is uneven, the liquid LW moves in the first portion 114 with high-speed movement of the wafer stage 45. That is, since the height of the interface of the liquid LW varies according to the positions, the interface is not stable, and the pressure of the liquid LW fluctuates markedly. The fluctuation in pressure can decrease the exposure accuracy. Accordingly, in at least one exemplary embodiment the first portion 114 be substantially parallel to the surface of the wafer 40 (substantially parallel to the plane orthogonal to the optical axis OA).

Second Exemplary Embodiment

FIG. 12 is a schematic cross-sectional view showing a nozzle member 100d according to a second exemplary embodiment of the present invention. A face 115 of the nozzle member 100d has a liquid supply port 101, and a liquid recovery port 103 disposed on a side of the liquid supply opening 101 remote from the optical axis OA. The face 115 also has a first portion 114, and a second portion 111 including an inclined face between the liquid supply port 101 and the first portion 114. A recess 112d is provided between the first portion 114 and the liquid recovery port 103.

Similarly to the first exemplary embodiment, the first portion 114 and the second portion 111 are subjected to lyophilic treatment so that an interface of liquid LW is held at the first portion 114. Further, the liquid supply port 101 and a portion of the face 115 provided in the same plane as that of the liquid supply port 101 are also subjected to lyophilic treatment.

In the first exemplary embodiment shown in FIG. 2, when the liquid LW moves in the −X-direction with the −X-direction movement of the wafer stage 45, the distance between the liquid supply port 101 and the surface of the wafer 40 is shorter than the distance between the first portion 114 and the surface of the wafer 40. With this structure, the interface of the liquid LW does not easily reach the adjacency of the liquid supply port 101.

The second exemplary embodiment shown in FIG. 12 can provide an advantage similar to that of the first exemplary embodiment by setting the distance between the liquid supply port 101 and the wafer 40 to be shorter than the distance between the first portion 114 and the wafer 40. That is, when the liquid LW moves in the −X-direction with the −X-direction movement of the wafer stage 45, the interface of the liquid LW does not easily reach the adjacency of the liquid supply port 101.

Further, the distance between the liquid recovery port 103 and the surface of the wafer 40 is shorter than the distance between the first portion 114 and the surface of the wafer 40. This effectively restrains the liquid LW from spreading out during movement of the wafer stage 45, and facilitates easily sucking the liquid LW from the liquid recovery port 103. Further, since the recess 112d (a face including a portion concaved with respect to the wafer 40) is provided, the liquid LW is restrained from spreading outside the liquid recovery port 103 during high-speed movement of the wafer stage 45, and scattering of the liquid LW is suppressed. Moreover, by subjecting the recess 112d to liquid repellent treatment, the liquid LW is restrained from still remaining in the recess 112d. If the recess 112d is not subjected to liquid repellent treatment, the liquid LW easily collects and remains in the recess 112d. This can cause bubbles. Herein, a part of the nozzle member 100d serves as the face 115 including the recess 112d.

When the liquid LW is pure water, a fluorine resin can be used for liquid repellent treatment. In particular, when PTFE, PFA, or silane containing a perfluoroalkyl group is used, the contact angle of pure water with respect to the treated surface can be 90° or more.

While the recess 112d is provided in FIG. 12, the first portion 114 and the liquid recovery port 103 can be connected by an inclined face without forming the recess 112d.

Third Exemplary Embodiment

Figure 14:
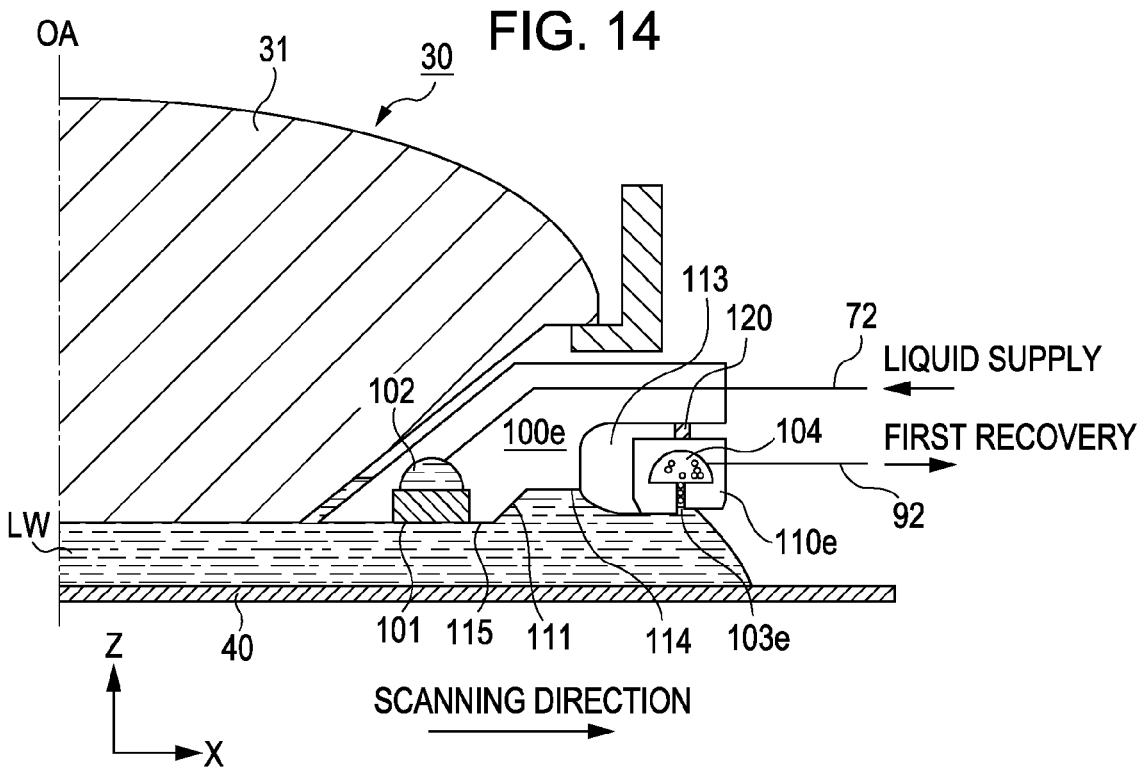
FIG. 14 is a cross-sectional view of the principle part of the exposure apparatus according to the third exemplary embodiment.

FIGS. 13 and 14 are schematic cross-sectional views showing a nozzle member 100e and a second member 110e according to a third exemplary embodiment of the present invention.

While the liquid recovery port 103 is provided in the nozzle member 100 in the above-described exemplary embodiments, in the third exemplary embodiment, a liquid recovery port 103e is provided in the second member 110e, and the second member 110e is supported by the nozzle member 100e via a vertical (Z-direction) driving mechanism 120. The nozzle member 100e and the second member 110e constitute a nozzle unit.

Liquid and gas are recovered from the liquid recovery port 103e into a medium recovery unit 90 via a space 104 and a liquid recovery pipe 92. The space 104 facilitates uniform recovery of the liquid LW from the liquid recovery port 103e, and forms a part of a recovery channel.

FIG. 13 shows a state in which the distance between the liquid recovery port 103e and a wafer 40 is short, and, conversely, FIG. 14 shows a state in which the distance is long. The condition for changing the distance is, for example, the moving speed and/or moving distance of the wafer stage 45. When the wafer stage 45 moves for a long distance and at a high speed, in at least one exemplary embodiment, in order to recover the liquid LW spreading out of the nozzle unit, the distance between the liquid recovery port 103e and the wafer 40 can be short. In this case, for example, when the distance is set at 0.5 mm or less, the spreading liquid LW can be easily recovered and reduced.

However, when the distance between the liquid recovery port 103e and the wafer 40 is short, vibration caused when the liquid LW is recovered from the liquid recovery port 103e is easily transmitted to the wafer stage 45, and this reduces control performance of the wafer stage 45. For this reason, during exposure that needs high accuracy, the wafer stage 45 can be precisely controlled by increasing the distance between the liquid recovery port 103e and the wafer 40, as shown in FIG. 14.

In a case in which the amount of gas ejected from the liquid recovery port 103e is increased to increase the amount of recovered liquid LW, when a plane that forms the liquid recovery port 103e is parallel to a plane perpendicular to the optical axis OA, much gas is sucked from a side of the liquid recovery port 103e close to the optical axis OA. Since liquid and gas are simultaneously sucked, bubbles are formed on the side of the liquid recovery port 103e close to the optical axis OA. In this case, when the moving direction of the wafer stage 45 is switched, the bubbles enter between a final optical member 31 and the wafer 40, and this can cause exposure failure. Accordingly, as shown in FIGS. 13 and 14, the plane that forms the liquid recovery port 103e is inclined with respect to the plane perpendicular to the optical axis OA. That is, the distance from the plane that forms the liquid recovery port 103e to the wafer 40 is set to increase away from the optical axis OA. Consequently, the liquid LW that will spread to the side of the liquid recovery port 103e remote from the optical axis OA can be recovered, and the gas is not easily sucked from the side of the liquid recovery port 103e close to the optical axis OA. Therefore, formation of bubbles on the side of the liquid recovery port 103e close to the optical axis OA can be suppressed, and exposure failure can be avoided.

In the third exemplary embodiment, a clearance (also referred to as a gas channel) 113 is provided between the nozzle member 100e and the second member 110e. If the clearance 113 is not provided, the pressure of the liquid LW changes when the second member 110e is driven vertically (in the Z-direction), and this can cause exposure failure. Accordingly, the clearance 113 is provided so that the space defined between the nozzle member 100e and the wafer 40 communicates with an outer space farther from the optical axis OA than the nozzle member 100e. The clearance 113 adjusts the pressure in the space between the nozzle member 100e and the second member 110e.

By subjecting a portion (recess) of the face 115 that forms the clearance 113 to liquid repellent treatment, in a manner similar to that adopted in the above-described exemplary embodiments, the liquid LW is restrained from entering the clearance 113. In order to more easily recover the liquid LW, the liquid recovery port 103e is subjected to lyophilic treatment, and a portion of the second member 110e farther from the optical axis OA than the liquid recovery port 103e is subjected to liquid repellent treatment. This can restrain the liquid LW from spreading out toward the side of the liquid recovery port 103e remote from the optical axis OA.

When the liquid LW is pure water, a fluorine resin can be used for liquid repellent treatment of the face 115. In particular, when PTFE, PFA, or silane containing a perfluoroalkyl group is used, the contact angle of the liquid LW with respect to the treated surface can be 90° or more.

In the third exemplary embodiment, the clearance 113 facilitates communication of the space between the nozzle member 100e and the wafer 40 with the outer space farther from the optical axis OA than the nozzle member 100e. Alternatively, the nozzle member 100e and the second member 110e can be connected by a flexible connecting member (formed of resin or metal) which does not easily transmit vibration. In this case, a gas supply/recovery pipe (not shown) that forms a gas channel is provided to extend through the connecting member that closes the clearance 113 between the nozzle member 100e and the second member 110e. The pressure in the gas supply/recovery pipe is measured, and gas is supplied and recovered through the gas supply/recovery pipe so that the measured pressure becomes equal to a predetermined pressure.

For example, the second member 110e can be divided into a plurality of sections around the optical axis OA so as to form gas channels that facilitates the communication of the space between the nozzle member 100e and the wafer 40 with the space on the side of the nozzle member 100e remote from the optical axis OA.

Fourth Exemplary Embodiment

Figure 15:
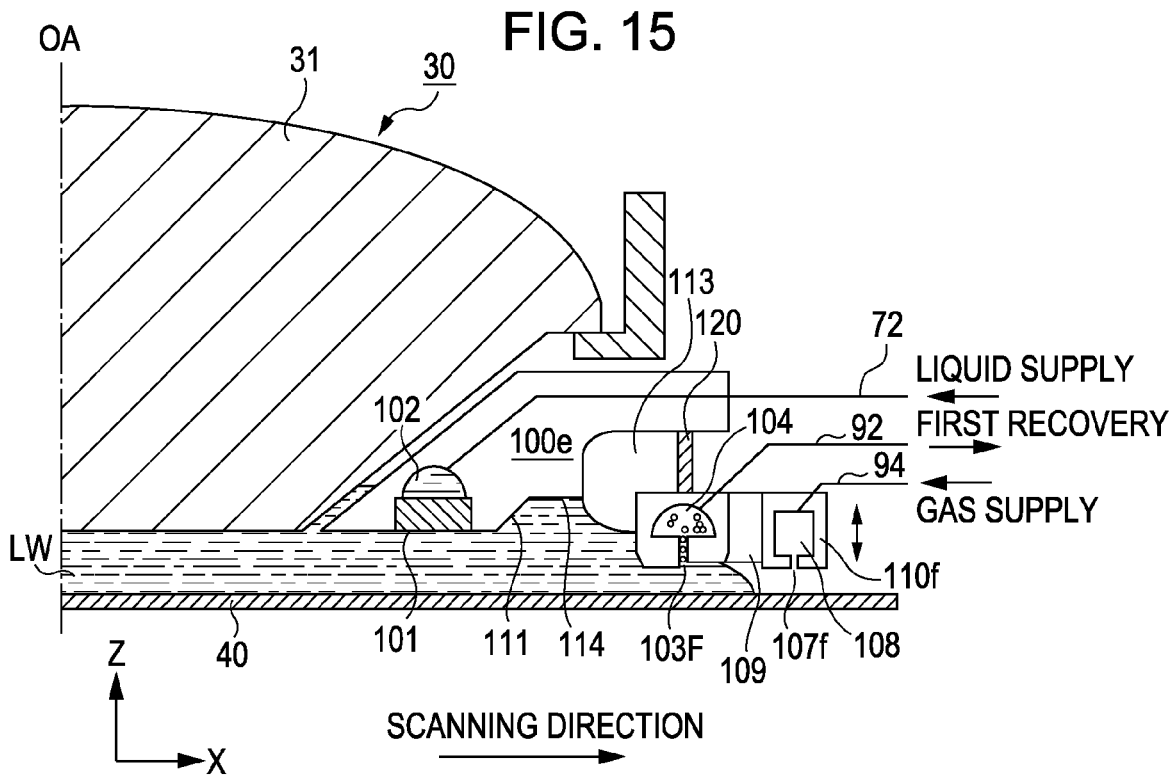
FIG. 15 is a cross-sectional view of the principle part of an exposure apparatus according to a fourth exemplary embodiment of the present invention.

FIG. 15 is a schematic cross-sectional view showing a nozzle member 100e and a second member 110f that constitute a nozzle unit according to a fourth exemplary embodiment of the present invention.

In the fourth exemplary embodiment, a gas supply port (also referred to as a gas ejection port or a gas discharge port) 107f is provided in a portion of the second member 110f farther from the optical axis OA than a liquid recovery port 103f. The second member 110f is connected to the nozzle member 100e via a vertical (Z-direction) driving mechanism 120.

While the gas supply port 107f can be shaped like a slit as in FIG. 15, a porous member can be fitted therein. As the porous member, a porous body obtained by sintering a metal or inorganic material in the form of fibers or particles (powder) is particularly suitable. The porous body (a material that forms at least a surface of the body) can be formed, for example, of stainless steel, nickel, aluminum, $SiO_2$, SiC, or SiC having $SiO_2$ formed only on its surface by heat treatment.

The gas supply port 107f is connected to a gas supply pipe 94 via a space 108. The space 108 facilitates the uniform supply of gas from the gas supply port 107f, and forms a part of a gas channel. The gas supply pipe 94 is connected to a medium supply unit 70. In the fourth exemplary embodiment, the medium supply unit 70 includes not only the components adopted in the above-described exemplary embodiments, but also a gas temperature controller, a vapor generator, and a flow-rate controller for controlling the flow rate of supplied gas.

In the fourth exemplary embodiment, in order to recover liquid LW spreading out during high-speed movement of the wafer stage 45 and to suppress spreading of the liquid LW, the liquid LW is recovered from the liquid recovery port 103*f* while supplying gas from the gas supply port 107*f*. Through a clearance 109 provided between the gas supply port 107*f* and the liquid recovery port 103*f*, gas supplied from the gas supply port 107*f* flows into a space farther from the optical axis OA than the nozzle member 100*e*.

In general, when suction (recovery) of the liquid LW from the liquid recovery port 103*f* starts, the flow rate of the liquid LW at the liquid recovery port 103*f* markedly decreases, compared with a case in which gas is sucked. For this reason, excess liquid LW that cannot be sucked attempts to leak outward (toward the side of the liquid recovery port 103*f* remote from the optical axis OA). In the fourth exemplary embodiment, however, spreading of the liquid LW can be prevented by ejecting gas from the gas supply port 107*f* that is provided outside the liquid recovery port 103*f*. Further, the clearance 109 is provided between the liquid recovery port 103*f* and the gas supply port 107*f*. The clearance 109 has a cross sectional area such as not to suck the liquid LW, and forms the gas channel. Even if the clearance 109 is not provided, spreading of the leaking liquid LW during movement of the wafer stage 45 can be prevented or suppressed, compared with the case in which the gas supply port 107*f* is not provided.

Similarly to the above-described exemplary embodiments, exposure can be performed in accordance with the required throughput and accuracy by adjusting the distance between the second member 110*f* and the wafer 40.

The condition for changing the distance is, for example, the moving speed and/or moving distance of the wafer stage 45. When the wafer stage 45 moves for a long distance and at a high speed, in at least one exemplary embodiment, in order to suppress spreading of the liquid LW and to recover the liquid LW, the distance between the second member 110*f* and the wafer 40 can be short. In this case, spreading of the liquid LW can be suppressed by setting the distance, for example, at 0.5 mm or less.

However, when the distance between the second member 110*f* and the wafer 40 is short, vibration caused when the liquid LW is recovered from the liquid recovery port 103*f* is easily transmitted to the wafer stage 45, and this can reduce control performance of the wafer stage 45. For this reason, during exposure that needs high accuracy, the wafer stage 45 can be precisely controlled by increasing the distance between the second member 110*f* and the wafer 40. When the distance is longer than 0.5 mm, the liquid LW spreading out during high-speed movement of the wafer stage 45 easily remains because of gas supplied from the gas supply port 107*f*. Therefore, in this case, the supply of gas from the gas supply port 107*f* can be stopped. By this control, exposure can be performed in accordance with the required throughput and accuracy.

By subjecting the liquid recovery port 103*f* and its surroundings to lyophilic treatment and subjecting the surface of the remaining part of the second member 110*f* to liquid repellent treatment, spreading of the liquid LW can be suppressed with a smaller amount of supplied gas.

Similarly to the above-described exemplary embodiments, when the liquid LW is pure water, a fluorine resin can be used for liquid repellent treatment of the face 115 (including the surface of the second member 110*f*). In particular, when PTFE, PFA, or silane containing a perfluoroalkyl group is used, the contact angle of the liquid LW with respect to the surface of the treated surface can be 90° or more.

When the gas supplied to prevent scattering of the liquid LW is dry air or inert gas that does not contain vapor having the same composition as that of the liquid LW, the liquid LW easily evaporates, and the wafer 40 is cooled by the influence of heat of evaporation. Consequently, the temperature of the wafer 40 decreases, and the surface of the wafer 40 is deformed. This can decrease exposure accuracy.

Accordingly, in the fourth exemplary embodiment, vapor of the same substance as the liquid LW or vapor having the same composition as that of vapor of the liquid LW is mixed by a vapor generator (not shown) into the gas supplied from the gas supply port 107*f*. In other words, gas in which vapor of the liquid LW is mixed is supplied from the gas supply port 107*f*. Simultaneously, gas whose temperature is adjusted to a predetermined temperature by a gas temperature controller (not shown) is supplied. This can reduce evaporation of the liquid LW, and can limit the decrease in exposure accuracy resulting from heat of evaporation of the liquid LW.

In at least one exemplary embodiment, the amount of gas recovered from the liquid recovery port 103*f* is set to be substantially equal to or more than the amount of gas supplied from the gas supply port 107*f*. This setting can restrain the vapor evaporating from the interface of the liquid LW and the gas supplied from the gas supply port 107*f* from leaking into the space farther from the optical axis OA than the nozzle member 100*e*.

FIG. 16 shows a modification of the fourth exemplary embodiment. This modification is different from the fourth exemplary embodiment in a gas recovery port 121 provided outside the gas supply port 107*f*, a flexible connecting member 123 for connecting the second member 110*f* and a support member (barrel) 124 that supports the projection optical system 30, and a gas supply/recovery pipe 96 extending through the support member 124.

Vapor of liquid LW and gas supplied from the gas supply port 107*f* sometimes leak into the space farther from the optical axis OA than the nozzle member 100*e* because of the ejection angle of gas from the gas supply port 107*f* or scattering of the gas. For example, in a case in which the liquid LW is an organic or inorganic substance having a refractive index higher than that of pure water, when the liquid LW absorbs oxygen, the transmittance of the liquid LW for exposure light decreases, and the throughput also decreases. Therefore, an inert gas containing no oxygen, such as nitrogen, is suitably supplied from the gas supply port 107*f*. In a case in which an atmosphere in the space where the wafer stage 45 is provided is air, if the inert gas leaks to the side of the nozzle member 100*e* remote from the optical axis OA, measurement error of laser interferometers 56 and 58 is increased. Accordingly, leakage of the inert gas or vapor of the liquid LW can be reduced by placing the gas recovery port 121 on a side of the gas supply port 107*f* remote from the optical axis OA.

The support member 124 and the second member 110*f* are connected by the flexible connecting member 123 (e.g., formed of resin or metal) that does not easily transmit vibration, and the gas supply/recovery pipe 96 that forms a gas channel extends through the support member 124. Further, the pressure in the gas supply/recovery pipe 96 is measured, and supply and recovery of the gas are performed through the gas supply/recovery pipe 96 so that the measured pressure becomes equal to a predetermined pressure. With this structure, even if the second member 110*f* is vertically moved, the pressure in the clearance 113 can be substantially kept constant. Moreover, the oxygen concentration near the liquid LW can be reduced by using an inert gas that is the same as the gas supplied from the gas supply port 107*f* (the inert gas does not always need to have the same composition) as the gas supplied to the gas supply/recovery pipe 96.

Fifth Exemplary Embodiment

Figure 4:
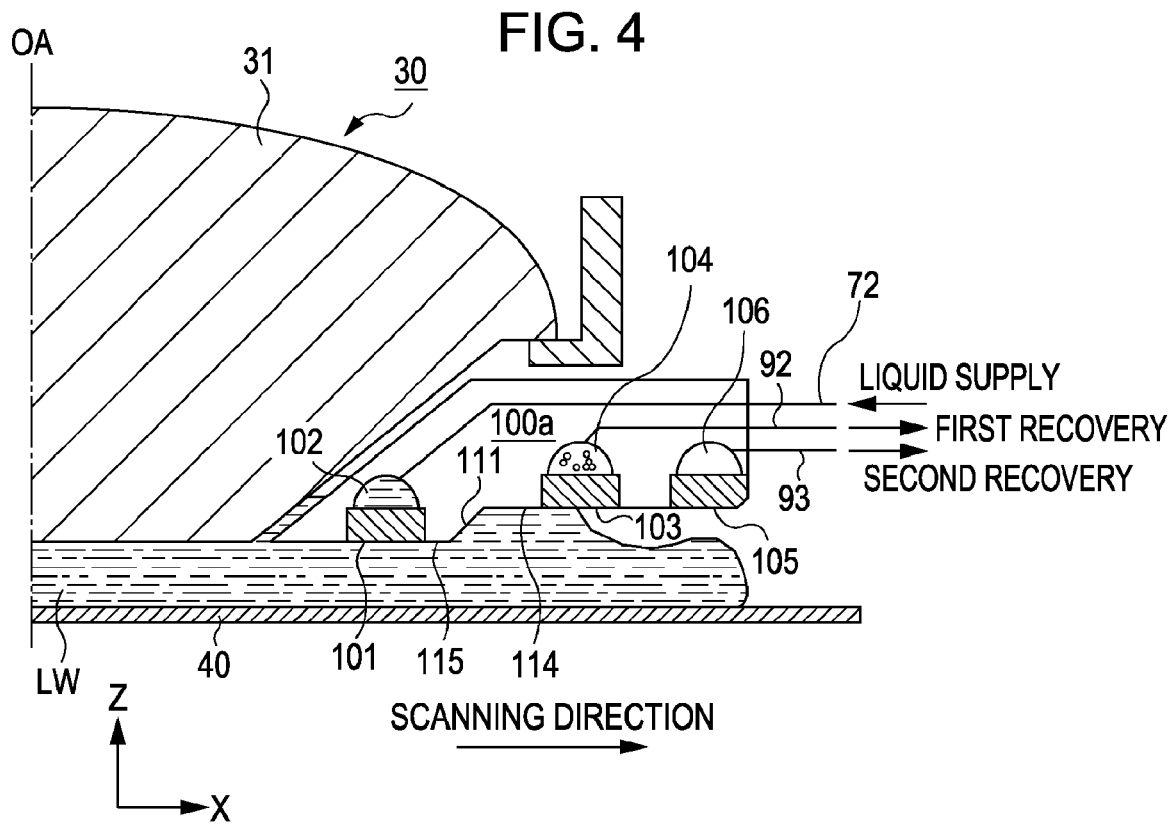
FIG. 4 is a cross-sectional view of the principle part of an exposure apparatus according to a fifth exemplary embodiment of the present invention.
Figure 5:
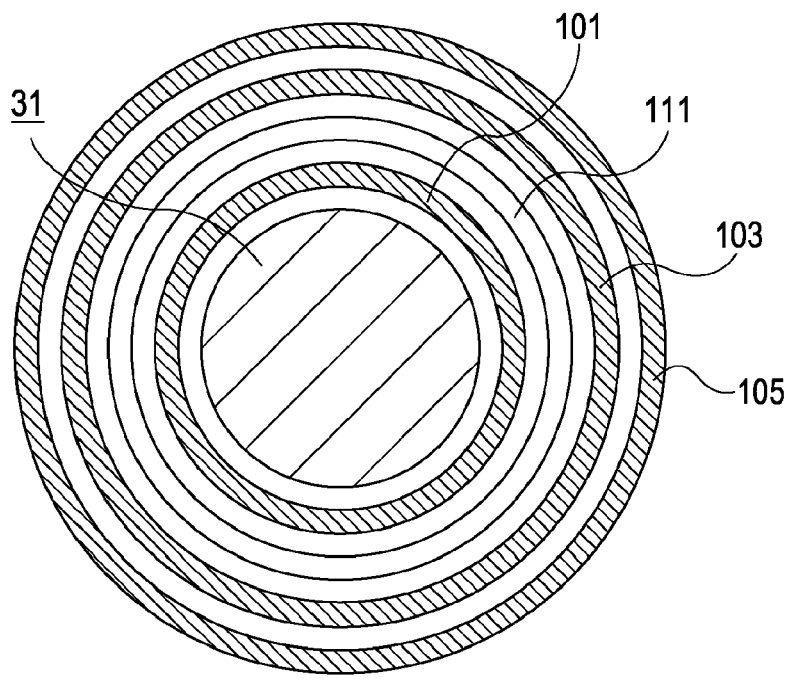
FIG. 5 is a schematic view of the principal part shown in FIG. 4, as viewed from the –Z-direction.

A fifth exemplary embodiment of the present invention will be described below with reference to FIGS. 4 and 5. FIG. 4 is a schematic cross-sectional view of a nozzle member 100a in the fifth exemplary embodiment, and FIG. 5 is a schematic view of the nozzle member 100a, as viewed from the −Z-direction. The nozzle member 100a includes a liquid supply port 101, a liquid recovery port 103 (also referred to as a first recovery port), and a second liquid recovery port (also referred to as a second recovery port) 105. The nozzle member 100a is different from the nozzle member 100 shown in FIG. 2 only in that the second liquid recovery port 105 is provided.

Through the second liquid recovery port 105, liquid LW that has spread out during high-speed movement of a wafer stage 45 is recovered. The second liquid recovery port 105 is connected to a liquid recovery pipe 93 via a space 106. The space 106 facilitates uniform recovery of the liquid LW from the second liquid recovery port 105. Gas can also be recovered through the second liquid recovery port 105. In the fifth exemplary embodiment, the second liquid recovery port 105 faces a wafer 40, and is concentric with the liquid recovery port 103. A porous member such as a sponge can be fitted in the second liquid recovery port 105, or the second liquid recovery port 105 can be shaped like a slit. As the porous member, a porous body obtained by sintering a metal or inorganic material in the form of fibers or particles (powder) is particularly suitable. The porous body (a material that forms at least a surface of the body) can be formed, for example, of stainless steel, nickel, aluminum, $SiO_2$, SiC, or SiC having $SiO_2$ formed only on its surface by heat treatment. The second liquid recovery port 105 is provided outside the liquid recovery port 103 with respect to the optical axis OA (on a side of the liquid recovery port 103 remote from the optical axis OA). With this structure, the liquid LW does not easily leak to the periphery of a projection optical system 30. While the second liquid recovery port 105 is annular in the fifth exemplary embodiment, as shown in FIG. 5, it can have other shapes, similarly to the liquid supply port 101. Alternatively, the second liquid recovery port 105 can be intermittently formed around the projection optical system 30.

Sixth Exemplary Embodiment

Figure 6:
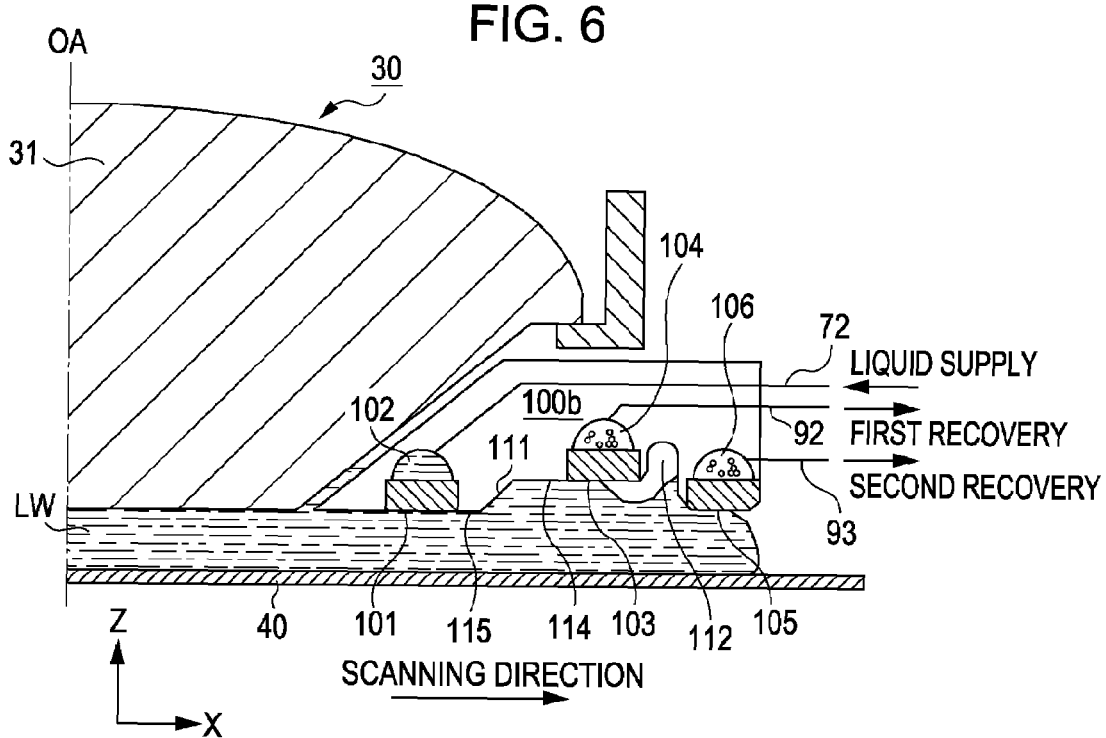
FIG. 6 is a cross-sectional view of the principle part of an exposure apparatus according to a sixth exemplary embodiment of the present invention.

FIG. 6 is a schematic cross-sectional view showing a nozzle member 100b according to a sixth exemplary embodiment of the present invention. The nozzle member 100b includes a liquid supply port 101, a liquid recovery port 103, and a second liquid recovery port 105. As shown in FIG. 6, the distance between the second liquid recovery port 105 and a wafer 40 is shorter than the distance between the liquid recovery port 103 and the wafer 40, so that it is possible to easily suck liquid LW that has thinly spread out when a wafer stage 45 is moved at a higher speed. Further, since a groove (a face that is concave with respect to the wafer 40) 112 is provided between the liquid recovery port 103 and the second liquid recovery port 105, the liquid LW is restrained from leaking to the outer periphery of the second liquid recovery port 105, and scattering of the liquid LW can be suppressed. By subjecting the groove 112 to liquid repellent treatment, the liquid LW is prevented from remaining in the groove 112. If liquid repellent treatment is not performed, the liquid LW easily remains in the groove 112, and bubbles are formed thereby. A part of the nozzle member 100b forms the concave face.

When the liquid LW is pure water, a fluorine resin can be used for liquid repellent treatment. In particular, when PTFE, PFA, or silane containing a perfluoroalkyl group is used, the contact angle of the treated surface can be 90° or more.

While the groove 112 is provided in FIG. 6, the liquid recovery port 103 and the second liquid recovery port 105 can be connected by an inclined face without forming the groove 112. In this case, the effect of preventing the liquid LW from leaking outside the second liquid recovery port 105 is less than in the configuration shown in FIG. 6. However, a larger amount of liquid LW that has thinly spread out during high-speed movement of the wafer stage 45 can be recovered than in the case in which the second liquid recovery port 105 and the liquid recovery port 103 are disposed at the same height from the wafer 40, as shown in FIG. 4.

Seventh Exemplary Embodiment

Figure 7:
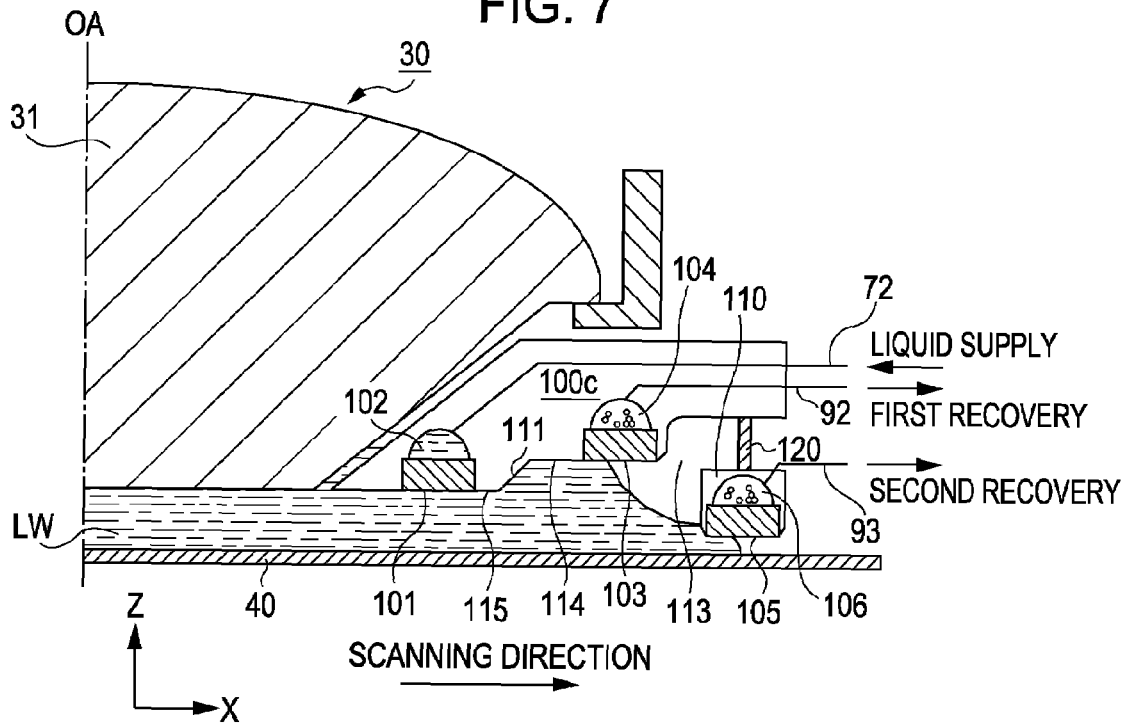
FIG. 7 is a cross-sectional view of the principle part of an exposure apparatus according to a seventh exemplary embodiment of the present invention.

FIGS. 7 and 8 are schematic cross-sectional views showing a nozzle member 100c according to a seventh exemplary embodiment of the present invention.

The seventh exemplary embodiment is different from the above-described exemplary embodiments in that a second member 110 having a second liquid recovery port 105 is connected to the nozzle member 100c by a vertical (Z-direction) driving mechanism 120.

Through the second liquid recovery port 105 of the second member 110, liquid LW spreading out during high-speed movement of a wafer stage 45 is recovered. Gas and liquid recovered through the second liquid recovery port 105 are collected into a medium recovery unit 90 via a space 106 and a liquid recovery pipe 93. The space 106 forms a channel through which the liquid LW is uniformly recovered from the second liquid recovery port 105.

FIG. 7 shows a case in which the distance between the second member 110 and a wafer 40 is short, and conversely, FIG. 8 shows a case in which the distance is long. The condition for changing the distance is, for example, the moving speed and/or moving distance of the wafer stage 45. When the wafer stage 45 moves for a long distance and at a high speed, in at least one exemplary embodiment, in order to recover the liquid LW thinly spreading, the distance between the second member 110 and the wafer 40 can be short. In this case, when the distance is set at 0.5 mm or less, the spreading liquid LW can be recovered easily.

However, when the distance between the second liquid recovery port 105 and the wafer 40 is short, vibration caused when the liquid LW is recovered from the second liquid recovery port 105 is easily transmitted to the wafer stage 45, and this reduces control performance of the wafer stage 45. For this reason, during exposure that needs high accuracy, the wafer stage 45 can be precisely controlled by increasing the distance between the second liquid recovery port 105 and the wafer 40, as shown in FIG. 8. Further, if exposure accuracy is decreased by vibration caused by recovery of the liquid LW from the second liquid recovery port 105, it is useful to stop the recovery.

In the seventh exemplary embodiment, a clearance (also referred to as a gas channel) 113 is provided between the second member 110 and the nozzle member 100c. In contrast to the amount of liquid supplied from the liquid supply port 101, much gas is recovered from the liquid recovery port 103. If the clearance 113 is not provided, much gas is sucked from a clearance between the second liquid recovery port 105 and the wafer 40, and the flow rate of the gas exceeds several tens of meters per second. An interface of the liquid LW is made unstable by the influence of the flowing gas. This forms bubbles, and causes exposure failure. Accordingly, the clearance (gas channel) 113 is provided so that a space between the nozzle member 100c and the wafer 40 communicates with a space outside the nozzle member 100c with respect to the optical axis OA (a space farther from the optical axis OA than the nozzle member 100c) (so that gas can move between the spaces). The clearance 113 adjusts the pressure in the space filled with gas.

Similarly to the above-described exemplary embodiments, the liquid LW can be prevented from remaining in the clearance 113 by subjecting walls, which define the clearance 113, to liquid repellent treatment. Further, in order to more easily recover the liquid LW, the second liquid recovery port 105 is subjected to lyophilic treatment, and a part of the second member 110 other than the second liquid recovery port 105 is subjected to liquid repellent treatment. This can restrain the liquid LW from spreading toward a side outside the second member 110 with respect to the optical axis OA (to a side farther from the optical axis OA than the second member 110).

When the liquid LW is pure water, a fluorine resin can be used for liquid repellent treatment. In particular, when PTFE, PFA, or silane containing a perfluoroalkyl group is used, the contact angle of the treated surface can be 90° or more.

While the clearance 113 facilitates the communication of the space between the nozzle member 100c and the wafer 40 with the outside of the nozzle member 100c in the seventh exemplary embodiment, alternatively, the nozzle member 100c and the second member 110 can be connected by a soft resin or flexible metal that does not easily transmit vibration. In this case, a gas supply/recovery pipe (not shown) that forms the gas channel can be connected to a member that closes the clearance 113, and supply and recovery of the gas can be performed so that a measured pressure in the gas supply/recovery pipe is kept at a predetermined pressure.

For example, gas channels for connecting the inside and outside of the second member 110 with respect to the optical axis OA can be formed by dividing the second member 110 into a plurality of sections. With this structure, the flow rate of the gas between the second liquid recovery port 105 and the wafer 40 does not exceedingly increase to, for example, several tens of meters per second.

Eighth Exemplary Embodiment

FIG. 9 is a schematic cross-sectional view showing a nozzle member 100c and a second member 110a according to an eighth exemplary embodiment of the present invention.

In the eighth exemplary embodiment, the second member 110a has a gas supply port (also referred to as a gas ejection port or a gas discharge port) 107 provided outside a second liquid recovery port 105 with respect to the optical axis OA (on a side of the second liquid recovery port 105 remote from the optical axis OA). The second member 110a is connected to the nozzle member 100c via a vertical (Z-direction) driving mechanism 120.

While the gas supply port 107 can be shaped like a slit as in FIG. 9, a porous member can be fitted therein. As the porous member, a porous body obtained by sintering a metal or inorganic material in the form of fibers or particles (powder) is particularly suitable. The porous body (a material that forms at least a surface of the body) can be formed, for example, of stainless steel, nickel, aluminum, $SiO_2$, SiC, or SiC having $SiO_2$ formed only on its surface by heat treatment.

The gas supply port 107 is connected to a gas supply pipe 94 via a space 108. The space 108 forms a channel through which gas is uniformly supplied from the gas supply port 107. The gas supply pipe 94 is connected to a medium supply unit 70. In the eighth exemplary embodiment, the medium supply unit 70 includes a gas-temperature controller, a vapor controller, and a flow-rate controller for controlling the flow rate of the supplied gas that are not shown, and the gas supply pipe 94, in addition to the components provided in the above-described exemplary embodiments.

In order to recover liquid LW that has thinly spread during high-speed movement of a wafer stage 45 and to suppress spreading of the liquid LW, the spreading liquid LW is recovered from the second liquid recovery port 105 while ejecting gas from the gas supply port 107. A clearance 109 is provided between the gas supply port 107 and the second liquid recovery port 105. Through the clearance 109, gas supplied from the gas supply port 107 flows into a space outside the nozzle member 100c.

In general, when suction (recovery) of the liquid LW from the second liquid recovery port 105 starts, the flow rate of the liquid LW at the second liquid recovery port 105 markedly decreases, compared with a case in which gas is sucked. For this reason, excess liquid LW that cannot be sucked attempts to further leak outward. In the eighth exemplary embodiment, however, spreading of the liquid LW can be suppressed by ejecting gas from the gas supply port 107 that is provided outside the second liquid recovery port 105 (on a side of the second liquid recovery port 105 remote from the optical axis OA). Further, the clearance 109 is provided between the second liquid recovery port 105 and the gas supply port 107. The clearance 109 has a cross sectional area such as not to suck the liquid LW, and forms the gas channel. Even if the clearance 109 is not provided, spreading of the liquid LW leaking during movement of the wafer stage 45 can be reduced, compared with the case in which the gas supply port 107 is not provided.

In the eighth exemplary embodiment, exposure can also be performed in accordance with the required throughput and accuracy by adjusting the distance between the second member 110a and the wafer 40, similarly to the above-described exemplary embodiments.

The condition for changing the distance is, for example, the moving speed and/or moving distance of the wafer stage 45. When the wafer stage 45 moves for a long distance and at a high speed, in at least one exemplary embodiment, in order to recover the spreading liquid LW, the distance between the second member 110a and the wafer 40 can be short. In this case, when the distance is set at 0.5 mm or less, spreading of the liquid LW can be suppressed.

However, when the distance between the second member 110a and the wafer 40 is short, vibration caused when the liquid LW is recovered from the second liquid recovery port 105 is easily transmitted to the wafer stage 45, and this reduces control performance of the wafer stage 45. For this reason, during exposure that needs high accuracy, the wafer stage 45 can be precisely controlled by increasing the distance between the second member 110a and the wafer 40. When the distance is set to be 0.5 mm or more, the liquid LW spreading out during high-speed movement of the wafer stage 45 easily remains because of the influence of gas supplied from the gas supply port 107. Therefore, in this case, supply of gas from the gas supply port 107 is stopped. Further, if exposure accuracy is decreased by vibration caused when the liquid LW is recovered from the second liquid recovery port 105, it is useful to stop recovery from the second liquid recovery port 105.

By this control, exposure can be performed in accordance with the required throughput and accuracy.

By subjecting the second liquid recovery port 105 to lyophilic treatment and subjecting a part of the second member 110a that forms the gas supply port 107, except the second liquid recovery port 105, to liquid repellent treatment, spreading of the liquid LW can be suppressed with a smaller amount of supplied gas.

Similarly to the above-described exemplary embodiments, when the liquid LW is pure water, a fluorine resin can be used for liquid repellent treatment. In particular, when PTFE, PFA, or silane containing a perfluoroalkyl group is used, the contact angle of the treated surface can be 90° or more.

When the gas supplied to prevent scattering of the liquid LW is dry air or inert gas that does not contain vapor having the same composition as that of the liquid LW, the liquid LW easily evaporates, and the wafer 40 is cooled by the influence of heat of evaporation. Consequently, the temperature of the wafer 40 decreases, and the surface of the wafer 40 is deformed. This decreases exposure accuracy.

Accordingly, in the eighth exemplary embodiment, vapor of the same substance as the liquid LW or vapor having the same composition as that of vapor of the liquid LW is mixed by a vapor controller (not shown) into the gas supplied from the gas supply port 107. In other words, gas in which vapor of the liquid LW is mixed is supplied from the gas supply port 107. Simultaneously, gas whose temperature is adjusted to a predetermined temperature by a gas temperature controller (not shown) is supplied. This suppresses evaporation of the liquid LW, and prevents the decrease in exposure accuracy resulting from heat of evaporation of the liquid LW.

In at least one exemplary embodiment, the total amount of gas recovered from the liquid recovery port 103 and the second liquid recovery port 105 is set to be substantially equal to or less than the amount of gas supplied from the gas supply port 107. This setting prevents the vapor evaporating from the interface of the liquid LW and the supplied gas from leaking outside the nozzle member 100c with respect to the optical axis OA (to a side of the nozzle member 100c remote from the optical axis OA).

Application to Device Manufacturing Method

Referring to FIGS. 10 and 11, a description will be given of an exemplary embodiment of a device manufacturing method using the above-described exposure apparatus 1. FIG. 10 is a flowchart showing a manufacturing procedure for devices (e.g., semiconductor chips such as ICs and LSIs, LCDs, and CCDs). In Step S1 (circuit design), a circuit pattern of a device is designed. In Step S2 (reticle fabrication), a reticle (also referred to as a mask or an original) having the designed circuit pattern is fabricated. In Step S3 (wafer fabrication), a wafer (also referred to as a substrate) is made of, for example, silicon. In Step S4 (wafer process) called a front end process, an actual circuit is formed on the wafer by using the reticle and the wafer by lithography. In Step S5 (assembly) called a back end process, a semiconductor chip is produced by using the wafer fabricated in Step S4. The back end process includes, for example, an assembly step (dicing, bonding) and a packaging step (chip encapsulation). In Step S6 (inspection), the semiconductor chip produced in Step S5 is subjected to various inspections such as an operation confirmation test and a durability test. A semiconductor device is completed through the above steps, and is then shipped (Step S7).

FIG. 11 is a detailed flowchart of the above-described wafer process (Step 4). In Step S11 (oxidation), the surface of the wafer is oxidized. In Step S12 (CVD), an insulating film is formed on the surface of the wafer. In Step S13 (electrode formation), electrodes are formed on the wafer by vapor deposition or by other known methods. In Step S14 (ion implantation), ions are implanted into the wafer. In Step S15 (resist coating), a photosensitive material is applied on the wafer. In Step S16 (exposure), the wafer is exposed via the circuit pattern of the reticle with the above-described exposure apparatus 1. In Step S17 (development), the exposed wafer is developed. In Step S18 (etching), a portion other than the developed resist image is removed. In Step S19 (resist stripping), the resist, which has become unnecessary after etching, is removed. By repeating these steps, multiple circuit patterns are formed on the wafer. According to this device manufacturing method, devices having a higher quality than before can be manufactured. In this way, the present invention also covers the device manufacturing method using the exposure apparatus 1, and devices manufactured by the method.

The present invention is not limited to the above exemplary embodiments and various changes and modifications can be made within the spirit and scope of the present invention. Therefore, to apprise the public of the scope of the present invention, the following claims are made.

This application claims priority benefit from Japanese Patent Application No. 2006-181894, entitled "EXPOSURE APPARATUS AND DEVICE MANUFACTURING METHOD" and filed May 1, 2006, and also claims priority benefit from Japanese patent Application No. 2007-119032, filed 27 Apr. 2007, both of which are hereby incorporated by reference herein in their entirety.

What is claimed is:

1. An exposure apparatus comprising:
   a movable substrate stage configured to hold the substrate;
   a projection optical system configured to project light from a reticle, and including a final optical element opposing the substrate; and
   a nozzle member including an opposing surface opposing the substrate,
   wherein the exposure apparatus exposes the substrate to light via the reticle, the projection optical system, and liquid filled in a gap between a final surface of the projection optical system and the substrate,
   wherein the opposing surface of the nozzle member includes:
   a supply port configured to supply the liquid into the gap, and provided substantially parallel to a plane orthogonal to an optical axis of the final optical element;
   a first recovery port configured to recover the liquid from the gap, and provided farther from the optical axis than the supply port; and
   a section provided between the supply port and the first recovery port, the section including a first portion substantially parallel to the plane orthogonal to the optical axis, and a second portion provided between the supply port and the first portion and including an inclined face, the inclined face being closer to the substrate as the inclined face is closer to the optical axis, and
   wherein a first distance between the first portion and the substrate is longer than a second distance between the supply port and the substrate.

2. The exposure apparatus according to claim 1, wherein the first portion and the second portion are lyophilic to the liquid.

3. The exposure apparatus according to claim 1, wherein the first recovery port is substantially parallel to the plane orthogonal to the optical axis, and a distance between the first recovery port and the substrate is substantially equal to the second distance.

4. The exposure apparatus according to claim 1, wherein the opposing surface further includes:

a second recovery port configured to recover the liquid from the gap, and provided farther from the optical axis than the first recovery port.

5. The exposure apparatus according to claim 4, wherein the first recovery port and the second recovery port are substantially parallel to the plane orthogonal to the optical axis, and at least one of a distance between the first recovery port and the substrate and a distance between the second recovery port and the substrate is shorter than the first distance.

6. The exposure apparatus according to claim 1, wherein the opposing surface further includes:
   a third portion provided between the first portion and the first recovery port, and including a concave portion that is concave with respect to the substrate.

7. The exposure apparatus according to claim 4, wherein the opposing surface further includes:
   a fourth portion provided between the first recovery port and the second recovery port, and including a concave portion that is concave with respect to the substrate.

8. The exposure apparatus according to claim 6, wherein the concave portion is repellent to the liquid.

9. The exposure apparatus according to claim 7, wherein the concave portion is repellent to the liquid.

10. The exposure apparatus according to claim 1, wherein the first recovery port is configured to move parallel to the optical axis.

11. The exposure apparatus according to claim 4, wherein the second recovery port is configured to move parallel to the optical axis.

12. The exposure apparatus according to claim 1, wherein the opposing surface further includes:
   a gas ejection port or gas discharge port configured to eject gas toward the substrate, and provided farther from the optical axis than the first recovery port.

13. The exposure apparatus according to claim 6, further comprising:
   a gas channel configured to adjust a pressure in a space in contact with the concave portion.

14. The exposure apparatus according to claim 13, further comprising:
   a mechanism configured to perform at least one of supplying inert gas to the space via the gas channel and recovering inert gas from the space via the gas channel.

15. A method of manufacturing a device, comprising the steps of:
   exposing a substrate to light using an exposure apparatus as defined in claim 1;
   developing the exposed substrate; and
   processing the developed substrate to manufacture the device.

* * * * *